(12) United States Patent
Jun et al.

(10) Patent No.: US 9,812,552 B2
(45) Date of Patent: Nov. 7, 2017

(54) METHODS FOR FABRICATING SEMICONDUCTOR DEVICES

(71) Applicants: Hwi-Chan Jun, Yongin-si (KR); Heon-Jong Shin, Yongin-si (KR); Jae-Ran Jang, Suwon-si (KR)

(72) Inventors: Hwi-Chan Jun, Yongin-si (KR); Heon-Jong Shin, Yongin-si (KR); Jae-Ran Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/679,166

(22) Filed: Apr. 6, 2015

(65) Prior Publication Data

US 2016/0181399 A1 Jun. 23, 2016

(30) Foreign Application Priority Data

Dec. 18, 2014 (KR) ........................ 10-2014-0182970

(51) Int. Cl.

| | |
|---|---|
| *H01L 29/66* | (2006.01) |
| *H01L 21/28* | (2006.01) |
| *H01L 21/3213* | (2006.01) |
| *H01L 21/768* | (2006.01) |
| *H01L 21/8234* | (2006.01) |
| *H01L 29/40* | (2006.01) |

(52) U.S. Cl.
CPC .. *H01L 29/66553* (2013.01); *H01L 21/28238* (2013.01); *H01L 21/76816* (2013.01); *H01L 21/76897* (2013.01); *H01L 21/823431* (2013.01); *H01L 21/823475* (2013.01); *H01L 29/401* (2013.01); *H01L 29/66545* (2013.01); *H01L 21/823437* (2013.01)

(58) Field of Classification Search
CPC ......... H01L 21/28238; H01L 21/32134; H01L 21/32139; H01L 21/7688; H01L 21/76897; H01L 21/823431; H01L 21/423437; H01L 21/823468; H01L 21/823481; H01L 29/401; H01L 29/66545; H01L 29/66553
See application file for complete search history.

(56) References Cited

U.S. PATENT DOCUMENTS

| | | | |
|---|---|---|---|
| 8,421,077 | B2 | 4/2013 | Jain et al. |
| 8,580,628 | B2 | 11/2013 | Labonté et al. |
| 8,586,408 | B2 | 11/2013 | Chen et al. |
| 8,614,123 | B2 | 12/2013 | Wei et al. |
| 8,642,403 | B1 | 2/2014 | Cohen et al. |

(Continued)

FOREIGN PATENT DOCUMENTS

KR 1020040082482 9/2004

*Primary Examiner* — Seahvosh Nikmanesh
(74) *Attorney, Agent, or Firm* — Myers Bigel, P.A.

(57) ABSTRACT

Methods of forming a semiconductor device are provided. The methods may include forming a gate structure on a substrate, forming a first sacrificial pattern and a second sacrificial pattern on opposing sides of the gate structure respectively and partially replacing the first sacrificial pattern with a first insulating pattern such that a portion of the first sacrificial pattern remains in the first insulating pattern and replacing the second sacrificial pattern with a second insulating pattern. The methods may also include replacing at least some of the portion of the first sacrificial pattern that remains in the first insulating pattern with a conductive pattern.

19 Claims, 30 Drawing Sheets

(56) References Cited

U.S. PATENT DOCUMENTS

| | | | |
|---|---|---|---|
| 8,643,122 B2 | 2/2014 | Alptekin et al. | |
| 8,735,272 B2 | 5/2014 | Cai et al. | |
| 8,741,718 B2 | 6/2014 | Sardesai | |
| 8,741,753 B2 | 6/2014 | Choi et al. | |
| 8,742,510 B2 | 6/2014 | Baars et al. | |
| 9,099,343 B2* | 8/2015 | Kim | H01L 27/10855 |
| 2002/0001970 A1 | 1/2002 | Becker | |
| 2002/0074585 A1* | 6/2002 | Tsang | H01L 21/221 |
| | | | 257/302 |
| 2008/0233727 A1 | 9/2008 | Lee | |
| 2012/0286375 A1* | 11/2012 | Cai | H01L 21/82341 |
| | | | 257/412 |
| 2013/0189833 A1 | 7/2013 | Baars et al. | |
| 2013/0200454 A1 | 8/2013 | Anderson et al. | |
| 2013/0240990 A1 | 9/2013 | Yin et al. | |
| 2014/0145246 A1 | 5/2014 | Ning et al. | |

* cited by examiner

METHODS FOR FABRICATING SEMICONDUCTOR DEVICES

CROSS-REFERENCE TO RELATED APPLICATION

This U.S. non-provisional patent application claims priority under 35 §119 to Korean Patent Application No. 10-2014-0182970, filed on Dec. 18, 2014, in the Korean Intellectual Property Office, the disclosure of which is hereby incorporated by reference in its entirety.

BACKGROUND

The present disclosure generally relates to the field of electronics and, more particularly, to a semiconductor device.

Semiconductor devices including fin field effect transistors (FinFETs) have been developed to increase speed, to lower operating voltage as well as to increase bit density. Fin field effect transistors (FinFET) have 3-dimensional channels.

SUMMARY

A method of forming an integrated circuit device may include forming a gate structure on a substrate and forming a first sacrificial pattern and a second sacrificial pattern on opposing sides of the gate structure respectively. The method may also include partially replacing the first sacrificial pattern with a first insulating pattern such that a portion of the first sacrificial pattern remains in the first insulating pattern and replacing the second sacrificial pattern with a second insulating pattern. The method may further include replacing at least some of the portion of the first sacrificial pattern that remains in the first insulating pattern with a conductive pattern.

In various embodiments, the method may also include forming a source/drain region in the substrate. The conductive pattern may be electrically connected to the source/drain region.

According to various embodiments, the conductive pattern may contact the source/drain region.

According to various embodiments, the method may also include forming an insulating isolation pattern in the substrate. The second sacrificial pattern may overlie the insulating isolation pattern.

According to various embodiments, forming the first and second sacrificial patterns may include forming the first sacrificial pattern having an upper surface disposed lower than an upper surface of the gate structure, and partially replacing the first sacrificial pattern with the first insulating pattern may include forming a portion of the first insulating pattern overlying the upper surface of the first sacrificial pattern.

In various embodiments, the method may additionally include replacing the gate structure with a metal gate structure including a metal gate electrode before replacing the at least some of the portion of the first sacrificial pattern with the conductive pattern.

In various embodiments, forming the first and second sacrificial patterns may include forming the first and second sacrificial patterns including a non-insulating material including silicon. Partially replacing the first sacrificial pattern with the first insulating pattern and replacing the second sacrificial pattern with the second insulating pattern may include partially removing the first sacrificial pattern such that the portion of the first sacrificial pattern remains on the substrate and removing the second sacrificial pattern using an wet etching process.

According to various embodiments, the method may further include forming an etch stopping layer between the substrate and the first and second sacrificial patterns. The first and second sacrificial patterns may include polysilicon, and an etchant of the wet etching process may include ammonia ($NH_3$).

In various embodiments, replacing the at least some of the portion of the first sacrificial pattern with the conductive pattern may include entirely replacing the portion of the first sacrificial pattern that remains in the first insulating pattern with the conductive pattern.

In various embodiments, the conductive pattern may include a contact plug that is electrically connected to the substrate, and the contact plug may have a non-uniform width in a longitudinal direction of the gate structure. The width of the contact plug may monotonically decrease in a transverse direction of the gate structure from adjacent the gate structure to proximate a medial point of the contact plug along the transverse direction of the gate structure.

According to various embodiments, the contact plug may include a U-shaped sidewall having a base and legs that extend from the base away from the contact plug.

In various embodiments, forming the gate structure may include forming a first gate structure on the substrate, and replacing the at least some of the portion of the first sacrificial pattern that remains in the first insulating pattern with the conductive pattern may include removing the at least same of the portion of the first sacrificial pattern thereby forming a first opening in the first insulating pattern and forming a first conductive pattern in the first opening. The method may further include forming a second gate structure on the substrate, forming a third sacrificial pattern on a side of the second gate structure, replacing the third sacrificial pattern with a third insulating pattern, forming a second opening in the third insulating pattern and forming a second conductive pattern in the second opening concurrently with forming the first conductive pattern in the first opening.

A method of forming an integrated circuit device may include forming a first gate structure and a second gate structure on a substrate and forming a conductive pattern and an insulating pattern between the first and second gate structures. The conductive pattern may be wider adjacent the first and second gate structures compared to between the first and second gate structures.

In various embodiments, the conductive pattern may include a curved sidewall having a base and legs that extend from the base away from the conductive pattern.

In various embodiments, the method may also include forming a source/drain region in the substrate between the first and second gate structures. The conductive pattern may be electrically connected to the source/drain region.

According to various embodiments, the conductive pattern may contact the source/drain region.

In various embodiments, the method may further include forming a sacrificial pattern between the first and second gate structures, partially replacing the sacrificial pattern with the insulating pattern such that a portion of the sacrificial pattern remains on the substrate and replacing at least some of the portion of the sacrificial pattern with the conductive pattern. The sacrificial pattern may include a non-insulating material including silicon.

According to various embodiments, forming the sacrificial pattern between the first and second gate structures may include forming the sacrificial pattern in a recess defined by the first and second gate structures. The sacrificial pattern may be recessed toward the substrate with respect to upper surfaces of the first and second gate structures. Partially replacing the sacrificial pattern with the insulating pattern may include partially removing the sacrificial pattern such that the portion of the sacrificial pattern remains on the substrate and forming the insulating pattern in the recess and on the portion of the sacrificial pattern.

In various embodiments, the method may additionally include replacing the first and second gate structures with a first metal gate structure and a second metal gate structure, respectively before replacing the at least some of the portion of the sacrificial pattern with the conductive pattern. Each of the first and second metal gate structures may include a metal gate electrode.

A method of forming an integrated circuit device may include forming a plurality of gate structures on a substrate. The plurality of gate structures may define a plurality of recesses, a respective one of which is between respective adjacent ones of the plurality of gate structures. The method may also include forming a plurality of sacrificial patterns including a non-insulating material. A respective one of the plurality of sacrificial patterns may be in the respective one of the plurality of recesses. The method may further include replacing a first portion of a first one of the plurality of sacrificial patterns with a first insulating pattern such that a second portion of the first one of the plurality of sacrificial patterns remains on the substrate, replacing a second one of the plurality of sacrificial patterns with a second insulating pattern and replacing at least some of the second portion of the first one of the plurality of sacrificial patterns with a conductive pattern.

In various embodiments, forming the plurality of sacrificial patterns may include forming the first one of the plurality of sacrificial patterns having an upper surface disposed lower than an upper surface of one of the plurality of gate structures disposed on a side of the first one of the plurality of sacrificial patterns. Replacing the first portion of the first one of the plurality of sacrificial patterns with the first insulating pattern may include forming a portion of the first insulating pattern overlying the upper surface of the first one of the plurality of sacrificial patterns.

According to various embodiments, the method may further include replacing a respective one of the plurality of gate structures with a respective one of the plurality of metal gate structures before replacing the first portion of the first one of the plurality of sacrificial patterns with the first insulating pattern.

In various embodiments, forming the plurality of sacrificial patterns may include forming the plurality of sacrificial patterns including the non-insulating material including silicon, and replacing the first portion of the first one of the plurality of sacrificial patterns with the first insulating pattern may include removing the first portion of the first one of the plurality of sacrificial patterns using an wet etching process.

According to various embodiments, the method may additionally include forming an etch stopping layer between the substrate and the first one of the plurality of sacrificial patterns. The plurality of sacrificial patterns may include polysilicon, and an etchant of the wet etching process may include ammonia ($NH_3$).

According to various embodiments, forming the plurality of sacrificial patterns may include forming a third one of the plurality of sacrificial patterns on a side of a third one of the plurality of gate structures. Replacing the first portion of the first one of the plurality of sacrificial patterns with the first insulating pattern may include removing the first portion of the first one of the plurality of sacrificial patterns thereby forming a first opening in the first insulating pattern. Replacing the at least some of the second portion of the first one of the plurality of sacrificial patterns with the conductive pattern may include forming a first conductive pattern in the first opening. The method may also include replacing the third one of the plurality of sacrificial patterns with a third insulating pattern, forming a second opening in the third insulating pattern and forming a second conductive pattern in the second opening concurrently with forming the first conductive pattern in the first opening.

In various embodiments, the conductive pattern may include a contact plug that is electrically connected to the substrate.

In various embodiments, the method may further include forming a source/drain region in the substrate. The contact plug may contact the source/drain region.

In various embodiments, the contact plug may include a non-uniform width in a longitudinal direction of the plurality of gate structures.

According to various embodiments, the contact plug may include a curved sidewall having a base and legs that extend from the base away from the contact plug.

According to various embodiments, the method may further include forming an insulating isolation pattern in the substrate. Replacing the second one of the plurality of sacrificial patterns with the second insulating pattern may include replacing the second one of the plurality of sacrificial patterns with the second insulating pattern that overlies the insulating isolation pattern.

BRIEF DESCRIPTION OF THE DRAWINGS

Some embodiments of the present inventive concept will be described with reference to the attached drawings.

DETAILED DESCRIPTION OF THE EMBODIMENTS

Figure 1:
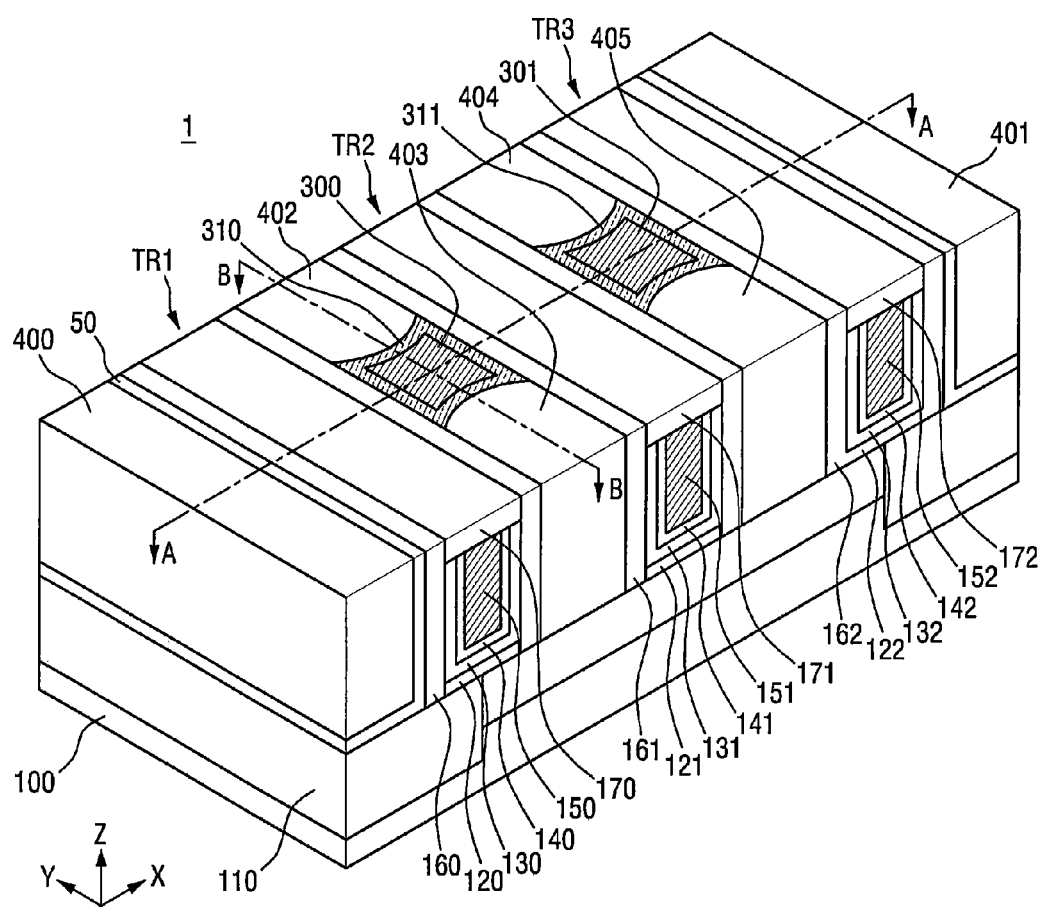
FIG. 1 is a perspective view of a semiconductor device according to some embodiments of the present inventive concept.

Some embodiments of the present inventive concept will be described hereinafter with reference to the accompanying drawings. The present inventive concept may, however, be embodied in different forms and should not be construed as limited to the embodiments set forth herein. Rather, these embodiments are provided so that this disclosure will be thorough and complete, and will fully convey the scope of the disclosure to those skilled in the art. The same reference numbers indicate the same components throughout the specification. In the drawings, the thickness of layers and regions may be exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the embodiments are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Some embodiments of the present inventive concept will be described with reference to perspective views, cross-sectional views, and/or plan views. It will be understood that the profile of views may be modified according to, for example, manufacturing processes. That is, the embodiments described herein are not intended to limit the scope of the present inventive concept but cover all changes and modifications that can be caused due to a change in manufacturing processes. Thus, regions shown in the drawings are illustrated in schematic form and the shapes of the regions are presented simply by way of illustration and not as a limitation.

Hereinafter, advantages, features, and methods of achieving them of the present inventive concept will be described with reference to the attached drawings and the embodiments. However, the present inventive concept is not limited to the embodiments which are disclosed herein and may be implemented in various other forms. The embodiments in the present specification are provided merely to let one of ordinary skill in the art to completely understand the scope of the present inventive concept.

When it is mentioned that one component is connected to or coupled to another component, it includes both a case where one component is directly connected to or coupled to another component and a case where further another component is interposed therebetween. On the other hand, when it is mentioned that one component is directly connected or directly coupled to another component, it indicates that there is no other component therebetween. Further, the expression "and/or" includes all combinations of the mentioned items.

The terms in the present specification are used to describe some embodiments and are not used to limit the scope of the present inventive concept. In the present specification, a singular form includes a plural form unless particularly stated otherwise. The terms "comprise" and/or "comprising" used in the specification do not exclude the possibility of existence or addition of one or more components, steps, operations, and/or devices.

Though such terms as "first" and "second" are used to describe various components, the components are not limited by such terms. Such terms are used only to distinguish one component from another. Hence, a first component may also be a second component within the technical idea of the present inventive concept.

Unless defined otherwise, all terms used in the present specification (including technical and scientific terms) may be used to have a meaning which may be commonly understood to one of ordinary skill in the art. Further, terms, which are defined in a generally used dictionary, are not ideally or excessively understood unless clearly defined in the present specification.

Hereinafter, a semiconductor device and a method of fabricating the same according to some embodiments of the present inventive concept will be described with reference to FIGS. 1 to 14.

Figure 2:
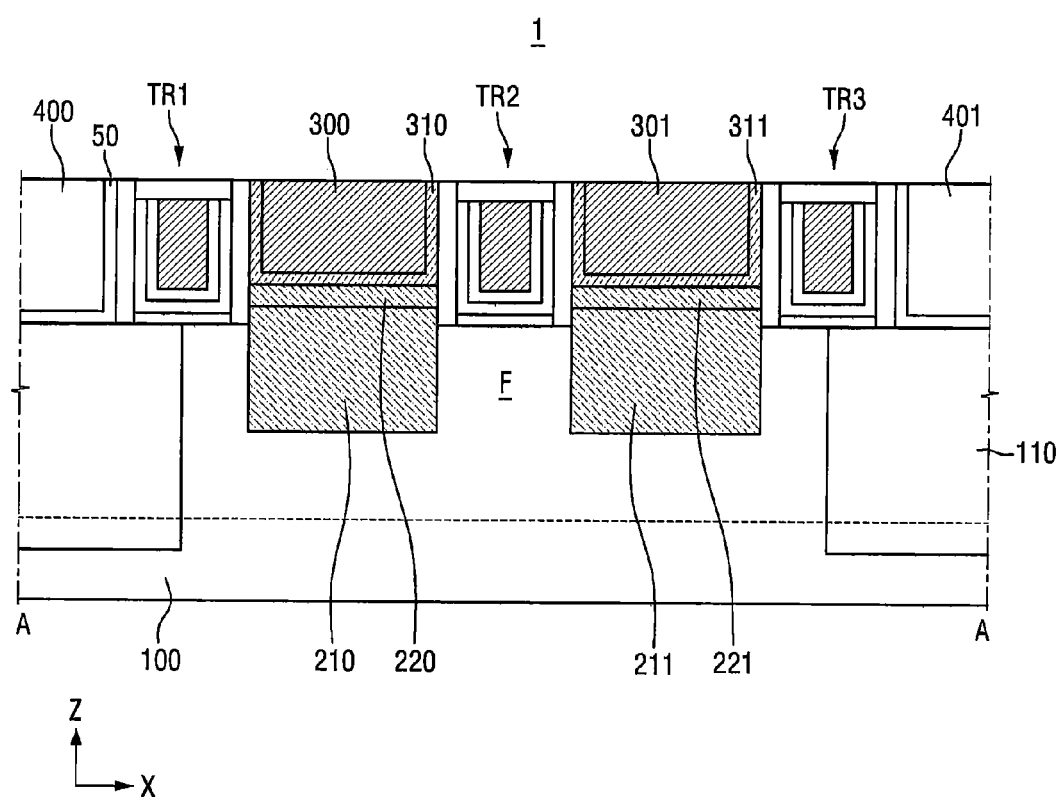
FIG. 2 is a cross-sectional view taken along the line A-A of FIG. 1.
Figure 3:
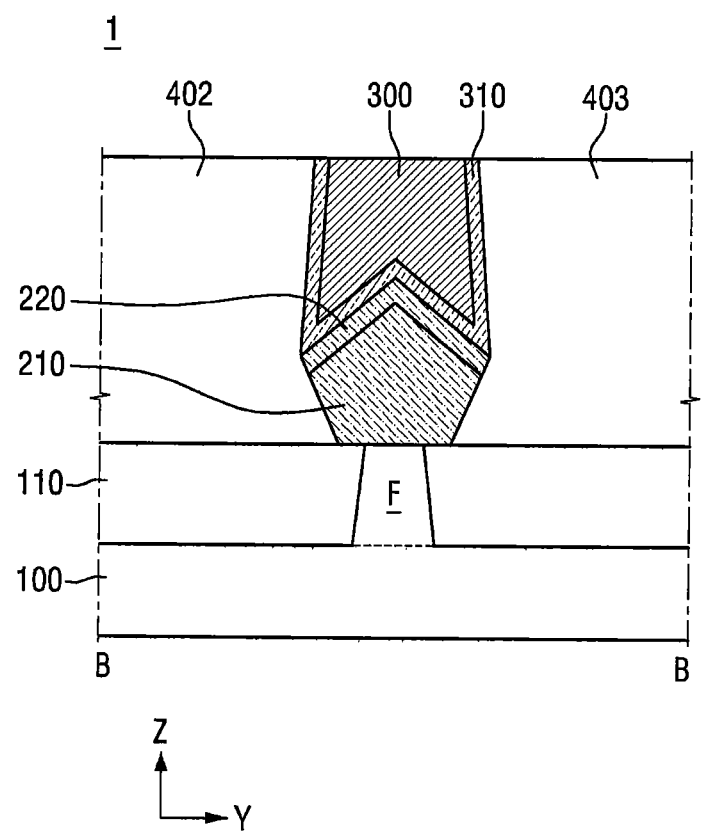
FIG. 3 is a cross-sectional view taken along the line B-B of FIG. 1.

Referring to FIGS. 1 to 3, a semiconductor device according to some embodiments of the present inventive concept will be described.

FIG. 1 is a perspective view of a semiconductor device 1 according to some embodiments of the present inventive concept. FIG. 2 is a cross-sectional view taken along the line A-A of FIG. 1. FIG. 3 is a cross-sectional view taken along the line B-B of FIG. 1.

Referring to FIGS. 1 to 3, the semiconductor device 1 may include a substrate 100, a field insulating layer 110, a fin F, an etch stopping layer 50, a first gate structure TR1, a second gate structure TR2, a third gate structure TR3, source/drain regions 210 and 211, silicides 220 and 221, contact metal patterns 300 and 301, contact barrier layers 310 and 311, and insulating layer patterns 400 through 405.

The substrate 100 may be a hard-type substrate such as a silicon substrate, a silicon on insulator (SOI), a gallium arsenide substrate, a silicon germanium substrate, a ceramic substrate, a quartz substrate, and a glass substrate for a display, or a flexible plastic substrate including, for example, polyimide, polyester, polycarbonate, polyethersulfone, polymethylmethacrylate, polyethylene naphthalate and/or polyethyleneterephthalate.

The field insulating layer 110 may be formed on the substrate 100 and may be used for device isolation. The field insulating layer 110 may be, for example, a High Density Plasma (HDP) oxide layer, a Spin On Glass (SOG) oxide layer and/or a Chemical Vapor Deposition (CVD) oxide layer, but the field insulating layer 110 is not limited thereto.

The fin F may be formed on the substrate 100. The fin F may protrude from the substrate 100. In some embodiments, the fin F may protrude from the substrate 100 in a third direction (e.g., Z direction) as illustrated in FIG. 1. The fin F may be part of the substrate 100 and may include an epitaxial layer that is grown from the substrate 100. The fin F may extend along a first direction (e.g., X direction) as illustrated in FIG. 1. The field insulating layer 110 may cover a portion of an upper surface of the substrate 100 and a side surface of the fin F.

The etch stopping layer 50 may include, for example, a silicon oxide layer and/or silicon nitride layer, but the etch stopping layer 50 is not limited thereto. The etch stopping layer 50 may determine an etching depth. In other words, an etching process may not etch the etch stopping layer 50 and may thus stop at the etch stopping layer 50.

The first gate structure TR1 may be formed on the fin F in a direction that crosses the fin F. In some embodiments, the first gate structure TR1 may extend along a second direction (e.g., Y direction) as illustrated in FIG. 1.

The first gate structure TR1 may include an interface layer 120, a gate insulating layer 130, a work function adjustment layer 140, a gate metal 150, a gate spacer 160 and a capping layer 170 which are sequentially formed on the fin F. A channel may be formed on both side surfaces that extend in the first direction and the upper surface of the fin F.

The interface layer 120 may be formed on the field insulating layer 110 and the fin F. The interface layer 120 may reduce defects at an interface between the field insulating layer 110 and the gate insulating layer 130.

The interface layer 120 may include, for example, a low-k material layer that has a dielectric constant k of 9 or less. For example, the interface layer 120 may include a silicon oxide layer (dielectric constant k is about 4) and/or a silicon oxynitride layer (dielectric constant k is between about 4 and about 8 according to contents of oxygen atoms and nitrogen atoms). Further, the interface layer 120 may include silicate and may be formed of a combination of the above mentioned layers.

The gate insulating layer 130 may be formed on the interface layer 120. In some embodiments, the interface layer 120 may be omitted, and the gate insulating layer 130 may be formed on the field insulating layer 110 and the fin F.

The gate insulating layer 130 may include a material having a high dielectric constant k. For example, the gate insulating layer 130 may include HfSiON, $HfO_2$, $ZrO_2$, $Ta_2O_5$, $TiO_2$, $SrTiO_3$, $BaTiO_3$ and/or $SrTiO_3$.

A thickness of the gate insulating layer 130 may vary according to device types. For example, when the gate insulating layer 130 is $HfO_2$, a thickness of the gate insulating layer 130 may be about 50 Å or less (e.g., between about 5 Å and 50 Å.) The thickness of the gate insulating layer 130 is, however, not limited thereto. According to some embodiments of the present inventive concept, as illustrated in FIG. 1, the gate insulating layer 130 may extend upward along a sidewall of the gate spacer 160.

The work function adjustment layer 140 may be formed on the gate insulating layer 130. The work function adjustment layer 140 may contact the gate insulating layer 130. The work function adjustment layer 140 may be used for work function adjustment.

In some embodiments, the work function adjustment layer 140 may include a metal nitride. For example, the work function adjustment layer 140 may include Mo, Pd, Ru, Pt, TiN, WN, TaN, Ir, TaC, RuN, TiAl, TaAlC, TiAlN and/or MoN. The work function adjustment layer 140 may be a single layer formed of TiN or a dual layer formed of a lower layer including TiN and an upper layer including TaN, but the work function adjustment layer 140 is not limited thereto.

According to some embodiments of the present inventive concept, as illustrated in FIG. 1, the work function adjustment layer 140 may also extend upward along the sidewall of the gate spacer 160.

The gate metal 150 may be formed on the work function adjustment layer 140. The gate metal 150 may contact the work function adjustment layer 140. In some embodiments, the gate metal 150 may be formed to fill a space defined by the work function adjustment layer 140. The gate metal 150 may include a conductive material such as tungsten (W) and aluminum (Al), but the gate metal 150 is not limited thereto.

The gate spacer 160 may be formed on at least one of side surfaces of the first gate structure TR1. The gate spacer 160 may include, for example, a nitride layer, an oxide layer and/or a low-k material.

The gate spacer 160 may have an I-shaped cross-section but a shape of the gate spacer 160 is not limited thereto. A cross-section of the gate spacer 160 may have a shape different from an I shape. For example, a cross-section of the gate spacer 160 may have curved shape or an L shape.

The gate spacer 160 may be formed as a single layer as illustrated in FIG. 1, but the gate spacer 160 may include multiple layers.

The capping layer 170 may be formed on the gate metal 150. In some embodiments, the capping layer 170 may contact the gate metal 150. The capping layer 170 may be formed to fill a space defined by an upper surface of the gate metal 150 of the first gate structure TR1. For example, the capping layer 170 may include silicon nitride SiN, but the capping layer 170 is not limited thereto.

The second gate structure TR2 may be formed on the fin F in a direction that crosses the fin F. In some embodiments, the gate structure TR2 may extend along the second direction.

The second gate structure TR2 may have a structure substantially the same as a structure of the first gate structure TR1. The second gate structure TR2 may include an interface layer 121, a gate insulating layer 131, a work function adjustment layer 141, a gate metal 151, a gate spacer 161 and a capping layer 171.

The interface layer 121, the gate insulating layer 131, the work function adjustment layer 141, the gate metal 151, the gate spacer 161 and the capping layer 171 are substantially the same as the interface layer 120, the gate insulating layer 130, the work function adjustment layer 140, the gate metal 150, the gate spacer 160 and the capping layer 170, respectively.

Further, the source/drain regions 210 and 211 may be formed on at least one of sides of the second gate structure TR2 and may be formed within the fin F. The gate spacer 161 may insulate the source/drain regions 210 and 211 from the second gate structure TR2.

In some embodiments, the semiconductor device 1 may be an NMOS transistor, and the source/drain regions 210 and 211 may include, for example, the same material as a material of the substrate or tensile stress materials. For example, the substrate 100 may be Si, the source/drain regions 210 and 211 may include Si or a material whose lattice constant is smaller than a lattice constant of Si (e.g., SiC and SiP). Tensile stress materials may improve mobility of carriers in a channel area by applying tensile stress to a lower portion of the fin F of the second gate structure TR2 (i.e., the channel area.)

In some embodiments, the semiconductor device 1 may be a PMOS transistor, and the source/drain regions 210 and 211 may include a compressive stress material. For example, the compressive stress material may be a material whose lattice constant is greater than lattice constant of Si (e.g., SiGe). The compressive stress material may improve mobility of carriers in the channel area by applying compressive stress to the lower portion of the fin F of the second gate structure TR2.

In some embodiments of the present inventive concept, the source/drain regions 210 and 211 may be formed using an epitaxial growth process, but the source/drain regions 210 and 211 may be formed using different processes.

The silicides 220 and 221 may be formed on the source/drain regions 210 and 211. The silicides 220 and 221 may include, for example, NiPtSi, NiSi, CoSi, and/or TiSi, but the silicides 220 and 221 are not limited thereto. The gate spacer 161 may insulate the silicides 220 and 221 from the second gate structure TR2.

The silicides 220 and 221 may be formed on upper surfaces of the source/drain regions 210 and 211 using a silicidation process before the contact metal patterns 300 and 301 and the contact barrier layers 310 and 311 are formed.

The third gate structure TR3 may be formed on the fin F in a direction that crosses the fin F. In some embodiments, the third gate structure TR3 may be extended along the second direction Y.

The third gate structure TR3 may have a structure substantially the same as the structure of the first gate structure TR1. The third gate structure TR3 may include an interface layer 122, a gate insulating layer 132, a work function adjustment layer 142, a gate metal 152, a gate spacer 162 and a capping layer 172.

The interface layer 122, the gate insulating layer 132, the work function adjustment layer 142, the gate metal 152, the gate spacer 162 and the capping layer 172 are substantially the same as the interface layer 120, the gate insulating layer 130, the work function adjustment layer 140, the gate metal 150, the gate spacer 160 and the capping layer 170, respectively.

The contact barrier layers 310 and 311 may be formed on sidewalls and bottom surfaces of the contact metal patterns 300 and 301. The contact barrier layers 310 and 311 may include, for example, a Ti layer, a TiN layer or a stacked layer including a Ti layer and a TiN layer.

The contact barrier layers 310 and 311 may be formed using an atomic layer deposition (ALD) process or a chemical vapor deposition (CVD) process.

The contact metal patterns 300 and 301 may be formed on the contact barrier layers 310 and 311. The contact metal patterns 300 and 301 may include metal. For example, the contact metal patterns 300 and 301 may include tungsten (W). The contact metal patterns 300 and 301 may be a contact which electrically connects upper semiconductor patterns to lower semiconductor patterns.

The insulating layer patterns 402 through 405 may be formed to fill spaces between two gate structures. The insulating layer patterns 402 and 403 may be formed to fill the space between the first gate structure TR1 and the second gate structure TR2, and the insulating layer patterns 404 and 405 may be formed to fill the space between the second gate structure TR2 and the third gate structure TR3. The insulating layer patterns 402 and 403 may electrically insulate the first gate structure TR1 and the second gate structure TR2, and the insulating layer patterns 404 and 405 may electrically insulate the second gate structure TR2 and the third gate structure TR3.

Referring again to FIG. 1, each of the contact metal patterns 300 and 301 may have a non-uniform width in the Y direction. The width of each of the contact metal patterns 300 and 301 may monotonically decrease in the X direction from adjacent the first gate structure TR1 or the second gate structure TR2 to proximate a medial point of the each of the contact metal patterns 300 and 301 in the X direction. In other words, the contact metal pattern 300 may be wider adjacent the first gate structure TR1 and the second gate structure TR2 compared to between the first gate structure TR1 and the second gate structure TR2, and the contact metal pattern 301 may be wider adjacent the second gate structure TR2 and the third gate structure TR3 compared to between the second gate structure TR2 and the third gate structure TR3. As illustrated in FIG. 1, each of the contact metal patterns 300 and 301 may have a curved sidewall that has a base and legs that extend from the base away from the each of the contact metal patterns 300 and 301. In some embodiments, each of the contact metal patterns 300 and 301 may have a U-shaped sidewall. Referring again to FIG. 3, each of the contact metal patterns 300 and 301 may have sidewalls that are slanted toward each other.

Figure 4:
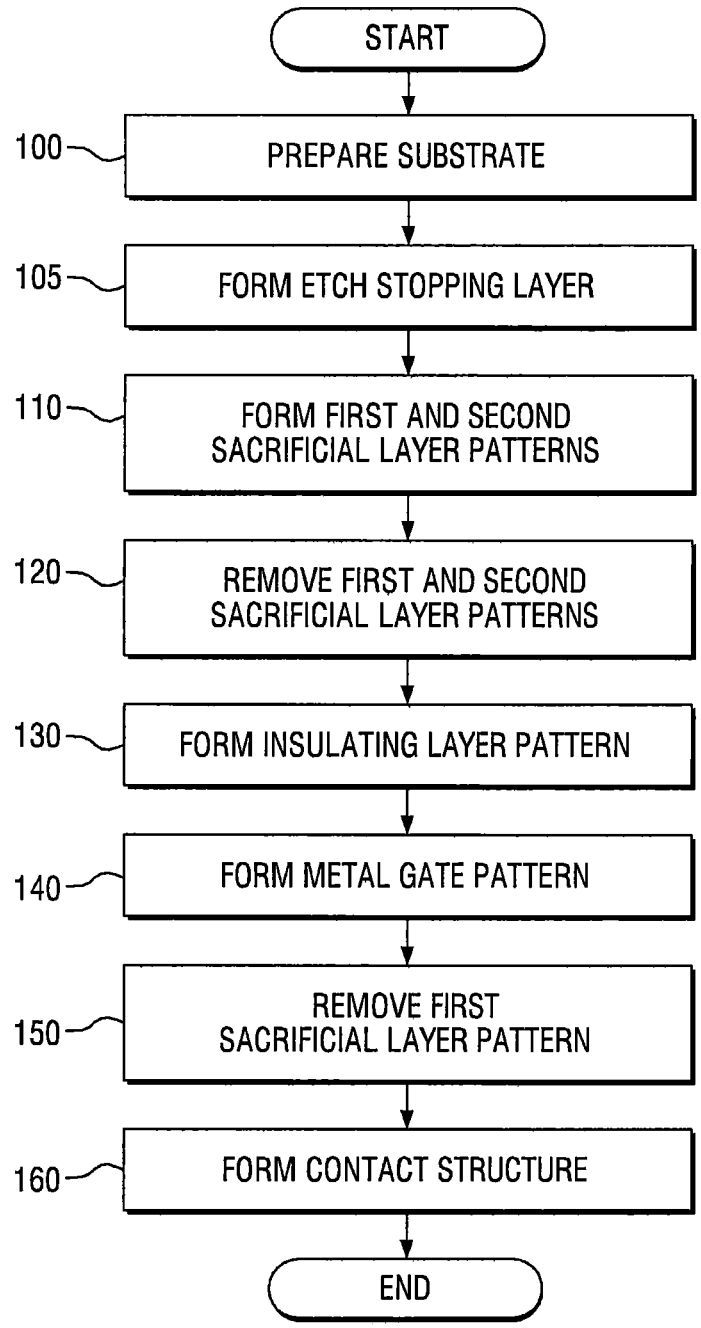
FIG. 4 is a flowchart illustrating a method of fabricating a semiconductor device according to some embodiments of the present inventive concept.
Figure 12A:
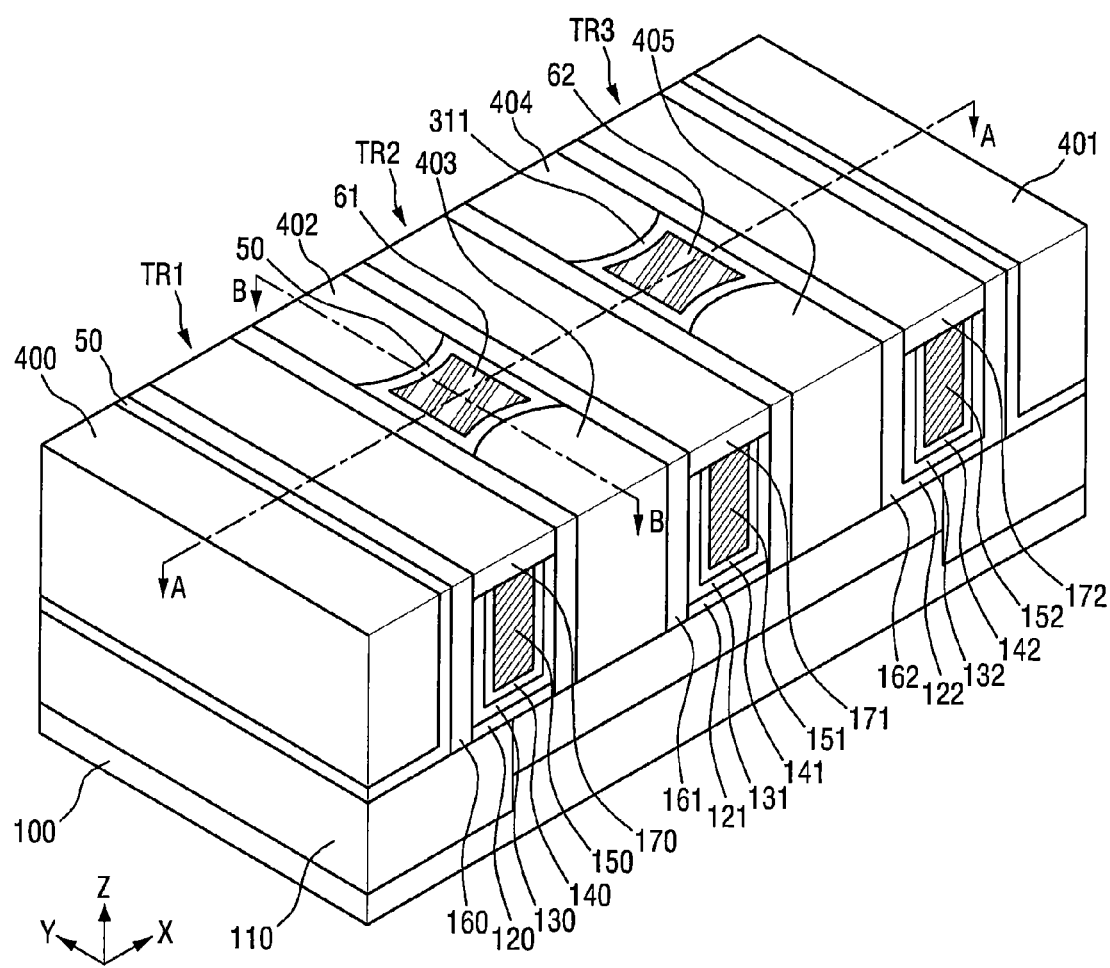
Figure 14A:
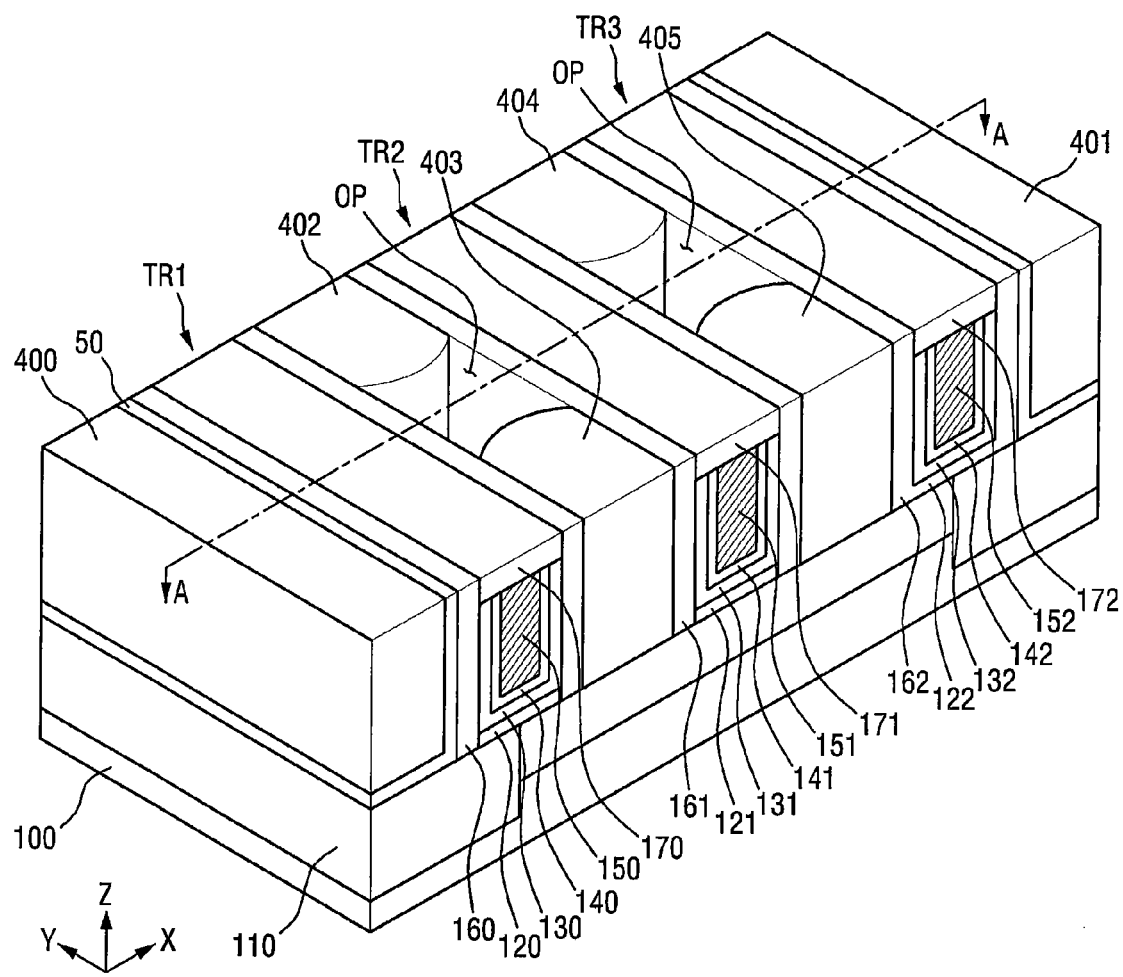

Hereinafter, a method of fabricating a semiconductor device according to some embodiments of the present inventive concept will be described with reference to FIGS. 4 through 7, 8A, 8B, 9 through 11, 12A, 12B, 13 and 14A and 14B. FIG. 4 illustrates a flowchart illustrating a method of fabricating a semiconductor device according to some embodiments of the present inventive concept. FIGS. 5 through 7, 8B, 9 through 11, 12B, 13 and 14B are cross-sectional views, FIG. 8A is a plan view and FIGS. 12A and 14A are perspective views illustrating intermediate operations of a method of fabricating a semiconductor device according to some embodiments of the present inventive concept.

Figure 5:
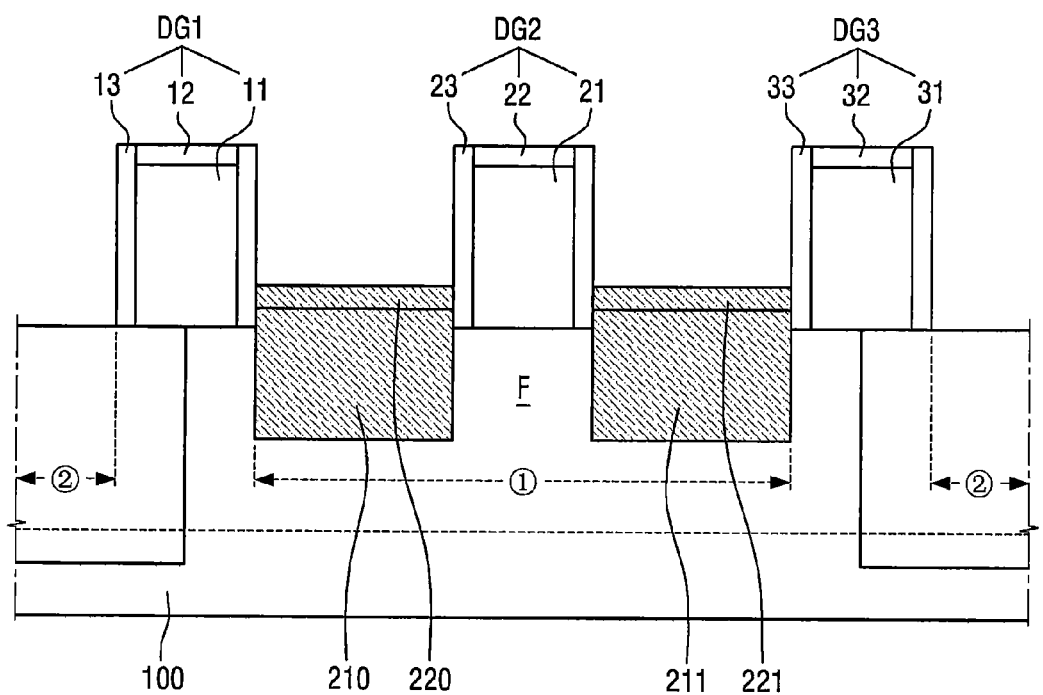
FIGS. 5 through 7, 8B, 9 through 11, 12B, 13 and 14B are cross-sectional views.

Referring to FIGS. 4 and 5, a substrate 100 may include a first area ① and a second area ②, and a first dummy gate pattern DG1, a second dummy gate pattern DG2 and a third dummy gate pattern DG3 may be formed on the substrate 100 (Block 100). In some embodiments, the first area ① may be disposed at one side of the first dummy gate pattern DG1, and the second area ② may be disposed at the other side of the first dummy gate pattern DG1 as illustrated in FIG. 5. The first dummy gate pattern DG1 may include a first dummy gate material 11, a first dummy capping layer 12 and a first dummy spacer 13, the second dummy gate pattern DG2 may include a second dummy gate material 21, a second dummy capping layer 22 and a second dummy spacer 23, and the third dummy gate pattern DG3 may include a third dummy gate material 31, a third dummy capping layer 32 and a third dummy spacer 33.

The first area ① may include the source/drain regions 210 and 211, and the second area ② may not include the source/drain regions 210 and 211.

The source/drain regions 210 and 211 and silicides 220 and 221 may be formed between the dummy gate patterns DG1, DG2 and DG3 which are formed on the substrate 100. The source/drain regions 210 and 211 and the silicides 220 and 221 may be formed at both sides of the second dummy gate pattern DG2. The source/drain regions 210 and 211 and the second dummy gate pattern DG2 may be insulated by the second dummy spacer 23, and the silicides 220 and 221 and the second dummy gate pattern DG2 may be insulated by the second dummy spacer 23.

Figure 6:
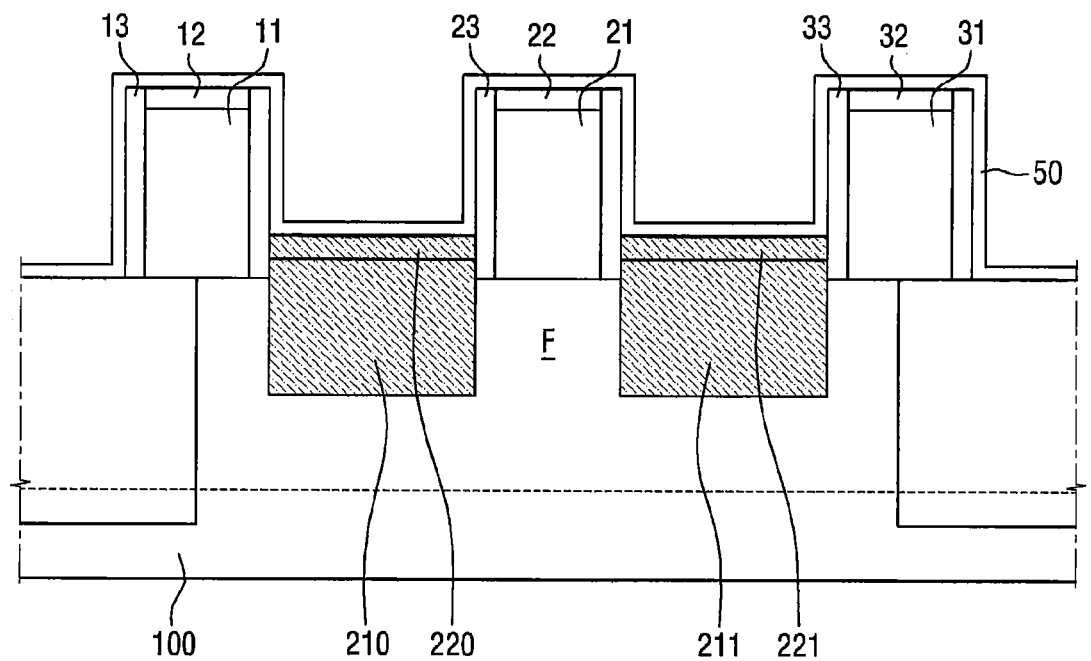

Referring to FIGS. 4 and 6, an etch stopping layer 50 may be formed on the substrate 100 (Block 105). The etch stopping layer 50 may be formed on the first dummy gate pattern DG1, the second dummy gate pattern DG2, the third dummy gate pattern DG3, and the silicides 220 and 221.

The etch stopping layer 50 may be formed of, for example, a silicon oxide layer and/or a silicon nitride layer, but the etch stopping layer 50 is not limited thereto. The etch stopping layer 50 may protect the silicides 220 and 221 during subsequent etching processes such that the silicides 220 and 221 may not be etched during the subsequent etching processes. The etch stopping layer 50 may determine an etching depth. In other words, an etching process may not etch the etch stopping layer 50 and may thus stop at the etch stopping layer 50.

Figure 7:
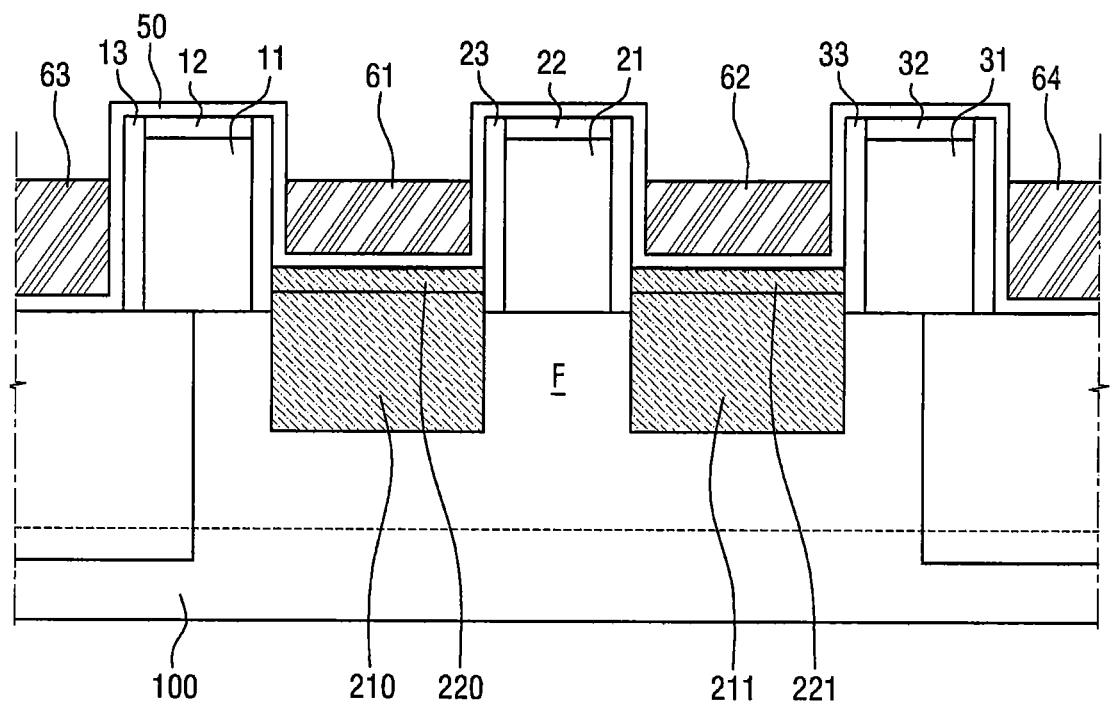
Figure 8A:
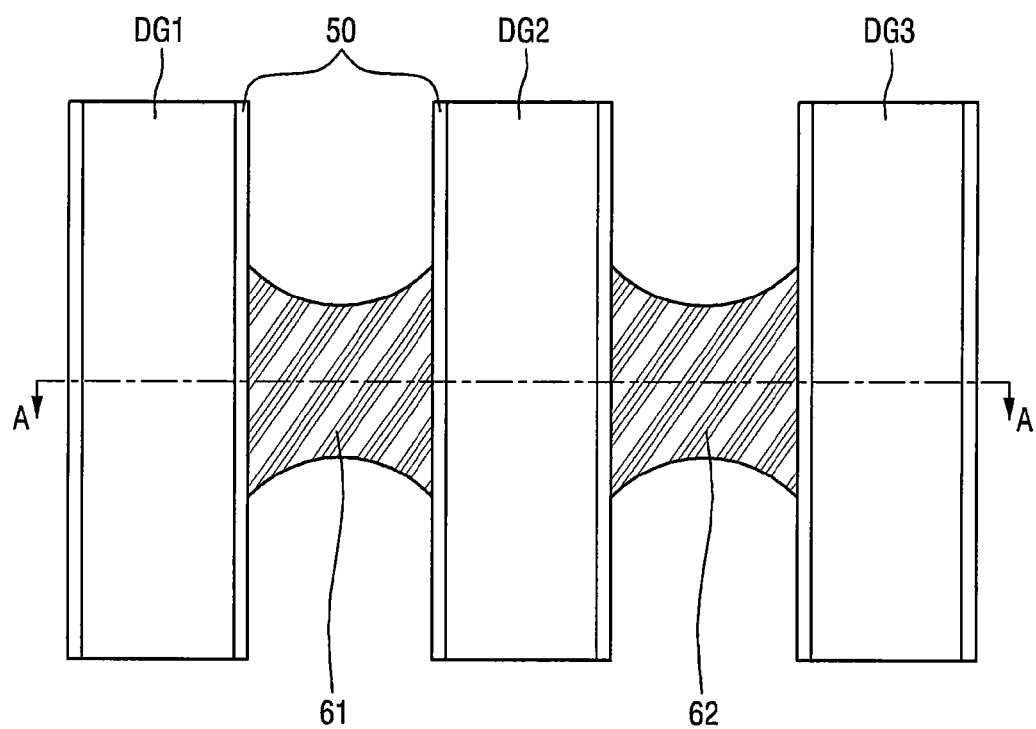
FIG. 8A is a plan view and FIGS. 12A and 14A are perspective views illustrating intermediate operations of a method of fabricating a semiconductor device according to some embodiments of the present inventive concept.

Referring to FIGS. 4 and 7, first sacrificial layer patterns 61 and 62 may be formed in the first area ① of the substrate 100, and second sacrificial layer patterns 63 and 64 may be formed on the second area ② (Block 110).

The first sacrificial layer patterns 61 and 62 and the second sacrificial layer patterns 63 and 64 may include a material having an etch selectivity with respect to the etch stopping layer 50. For example, the first sacrificial layer patterns 61 and 62 and the second sacrificial layer patterns 63 and 64 may include polysilicon.

Forming the first sacrificial layer patterns 61 and 62 and the second sacrificial layer patterns 63 and 64 may include forming sacrificial layer materials on the substrate 100 and partially removing an upper portion of the sacrificial layer materials using an etch process (e.g., an etchback process.)

In some embodiments, the first sacrificial layer patterns 61 and 62 and the second sacrificial layer patterns 63 and 64 may be formed using an etchback process, and heights of the first sacrificial layer patterns 61 and 62 and the second sacrificial layer patterns 63 and 64 may be lower than heights of the first dummy gate material 11, the second dummy gate material 21 and the third dummy gate material 31 as illustrated in FIG. 7.

Figure 8B:
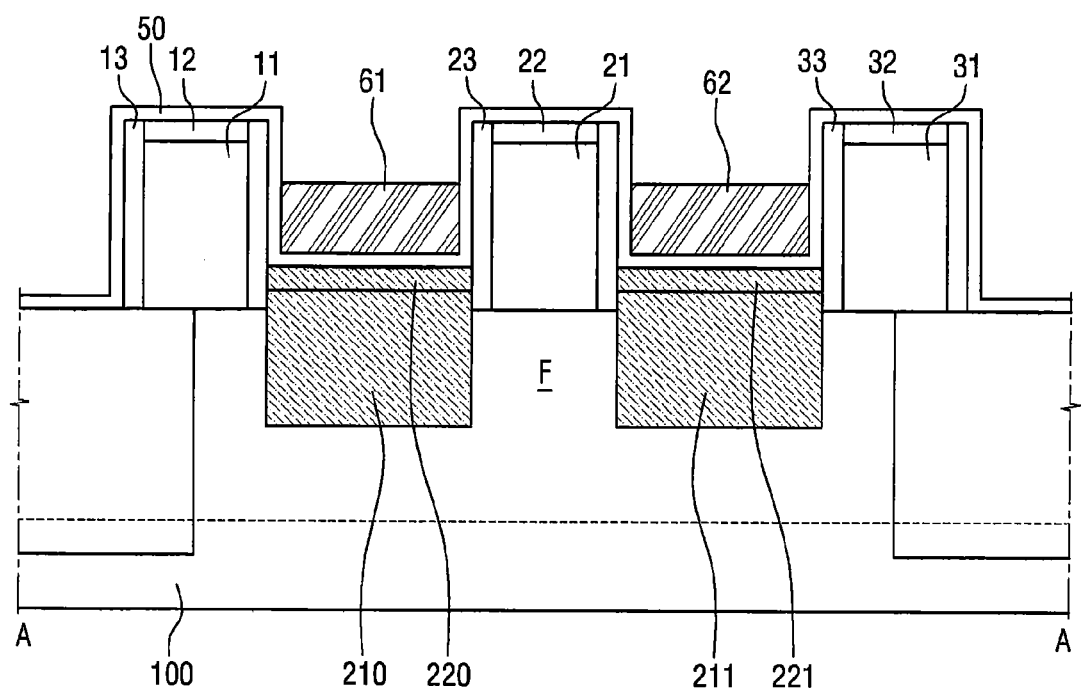

FIG. 8B is a cross-sectional view taken along the line A-A of FIG. 8A. Referring to FIGS. 4, 8A and 8B, the first sacrificial layer patterns 61 and 62 formed in the first area ① and the second sacrificial layer patterns 63 and 64 formed in the second area ② may be removed (Block 120). The first sacrificial layer patterns 61 and 62 may partially removed using, for example, an etching process such that portions of the first sacrificial layer patterns 61 and 62 may remain on the source/drain regions 210 and 211, respectively, as illustrated in FIG. 8A. Each of the first sacrificial layer patterns 61 and 62 that remains on the source/drain regions 210 or 211 may have a curved sidewall (e.g., a U-shaped sidewall) that has a base and legs that extend from the base away from the each of the first sacrificial layer patterns 61 and 62.

The second area ② may not include the source/drain regions 210 and 211, and the etch stopping layer 50 in the second area ② may be exposed after the second sacrificial layer patterns 63 and 64 are removed. The etch stopping layer 50 in the first area ① may partially exposed after the first sacrificial layer patterns 61 and 62 may partially removed.

The second sacrificial layer patterns 63 and 64 may be removed using a dry etching process and/or a wet etching process. In some embodiments, entire second sacrificial layer patterns may be removed.

Figure 9:
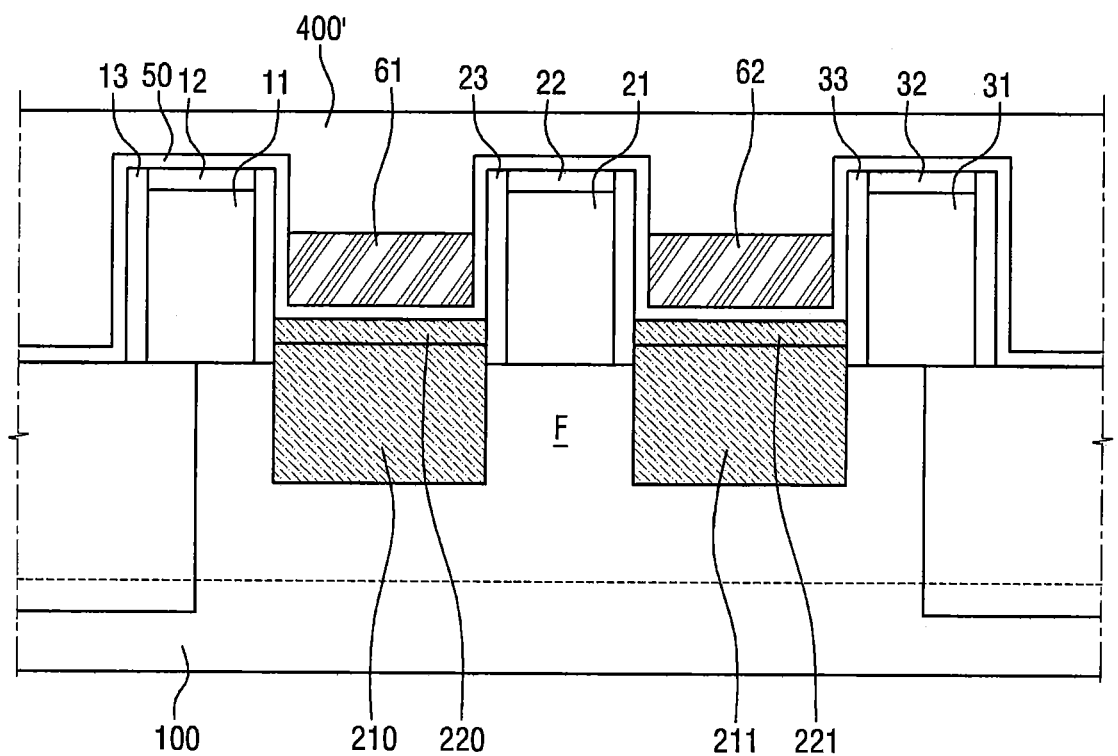
Figure 10:
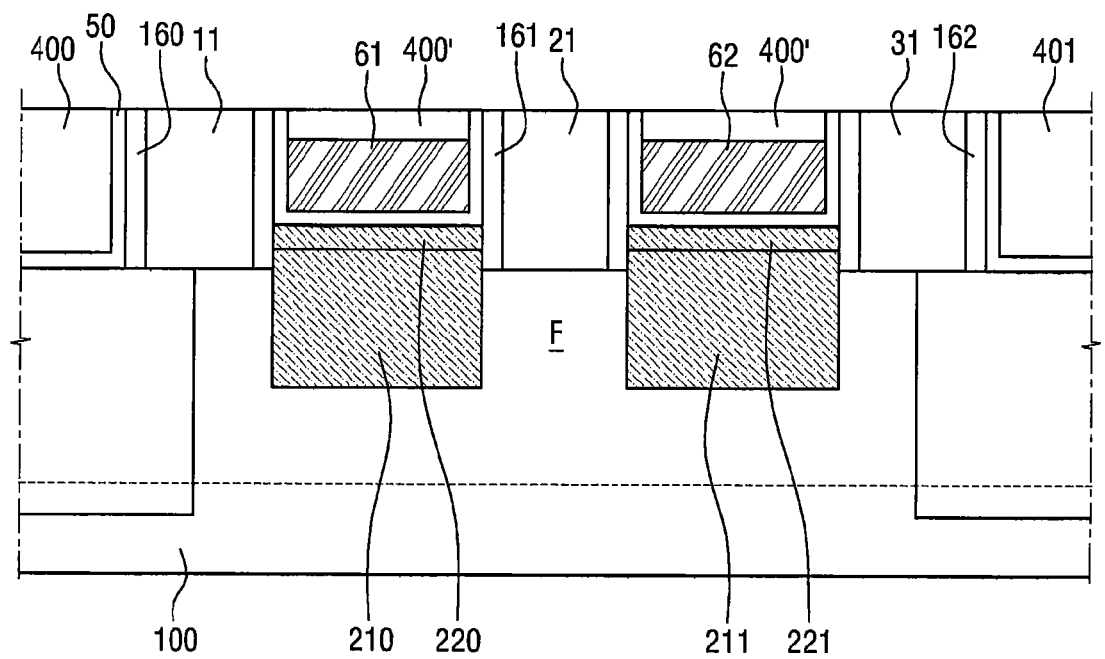
Figure 11:
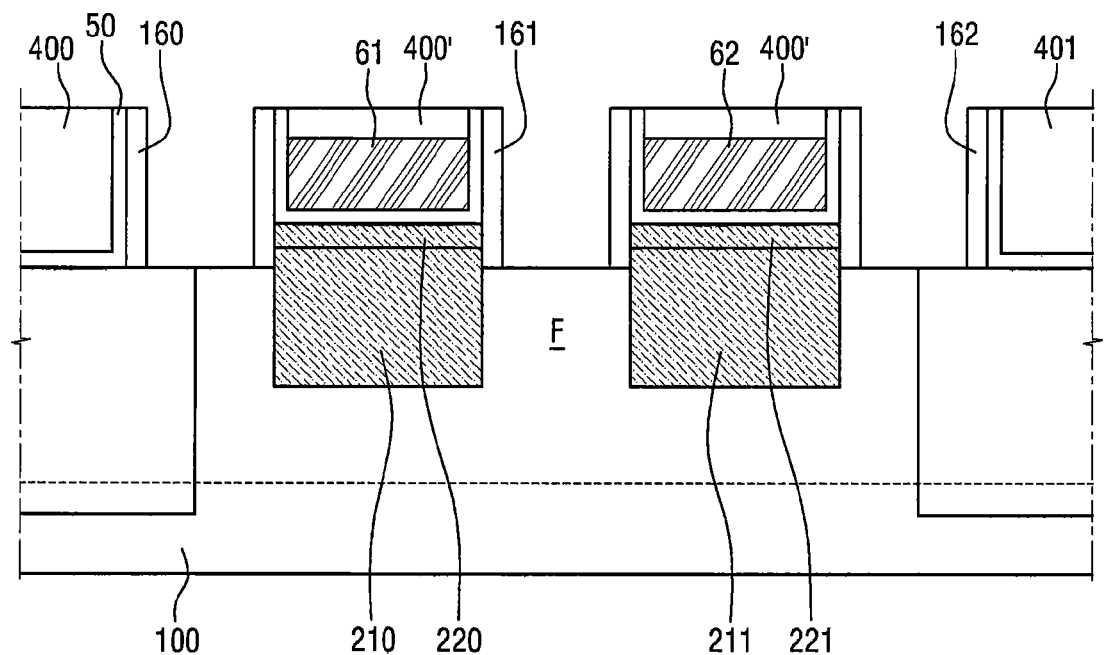

Referring to FIGS. 4, 9 and 10, insulating layer patterns 400 through 405 may be formed in the first area ① and the second area ② (Block 130). Forming the insulating layer patterns 400 through 405 may include forming an insulating layer 400' on the substrate 100 and removing upper portions of the insulating layer 400' using, for example, a planarization process (e.g., CMP process). Portions of the insulating layer 400' may remain on the first sacrificial layer patterns 61 and 62 in the first area ①. The insulating layer 400' may have an etch selectivity with respect to the first to third dummy gate materials 11, 21 and 31, and the first to third dummy gate materials 11, 21, and 31 may be selectively removed through a subsequent process. Upper portions of the first to third dummy spacers 13, 23 and 33 may also be removed such that the gate spacers 160, 161 and 162 may be formed.

The insulating layer patterns 400 and 401 may include a material different from the first sacrificial layer patterns 61 and 62 and the second sacrificial layer patterns 63 and 64. For example, the insulating layer patterns 400 and 401 may be a High Density Plasma (HDP) layer, a Flowable OXide (FOX) layer, a Tonen SilaZene (TOSZ) layer, a Spin On Glass (SOG) layer, a Undoped Silica Glass (UGS) layer, a tetraethyl ortho silicate (TEOS) layer and/or a Low Temperature Oxide (LTO) layer.

Figure 12B:
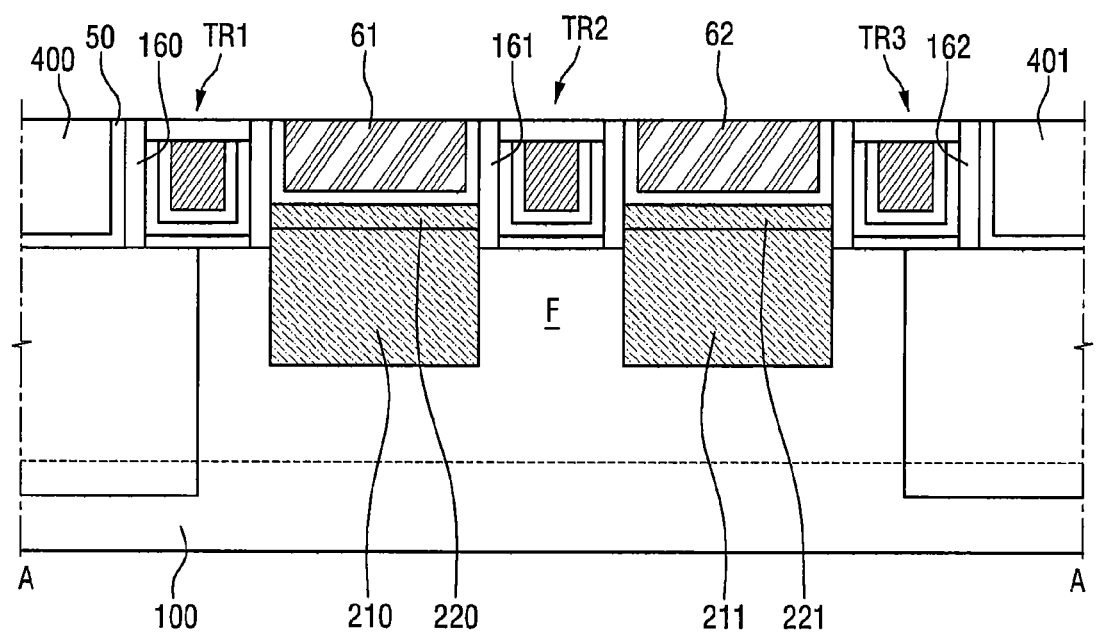
Figure 13:
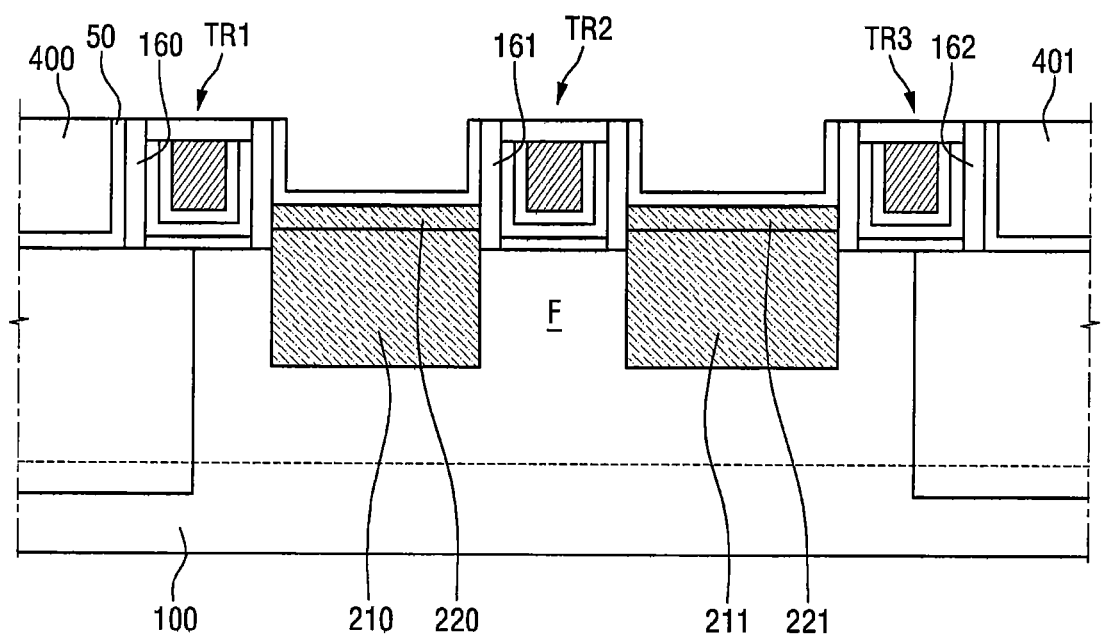

FIG. 12B is a cross-sectional view taken along the line A-A of FIG. 12A. Referring to FIGS. 4, 11, 12A and 12B, the first dummy gate pattern DG1, the second dummy gate pattern DG2, and the third dummy gate pattern DG3 are replaced with the first gate structure TR1, the second gate structure TR2, and the third gate structure TR3, respectively (Block 140). In some embodiments, a conventional replacement gate process may be used. The first sacrificial layer patterns 61 and 62 that remain on the source/drain regions 210 and 211 may be disposed between the insulating layer patterns 402 and 403 and between the insulating layer patterns 404 and 405.

In some embodiments, during a process of forming the first gate structure TR1, the second gate structure TR2, and the third gate structure TR3, an ILD protection scheme pattern (IPS pattern) may be formed on the insulating layer patterns 400 and 401 and the portions of insulating layer 400'. The IPS pattern may protect the insulating layer patterns 400 and 401 and the insulating layer 400' when a wet etching process is applied to the first dummy gate pattern DG1, the second dummy gate pattern DG2, and the third dummy gate patterns DG3. The IPS pattern may be removed using a subsequent process.

After forming the first gate structure TR1, the second gate structure TR2, and the third gate structure TR3, the portions of the insulating layer 400' in the first area ① may be removed using a planarization process.

Figure 14B:
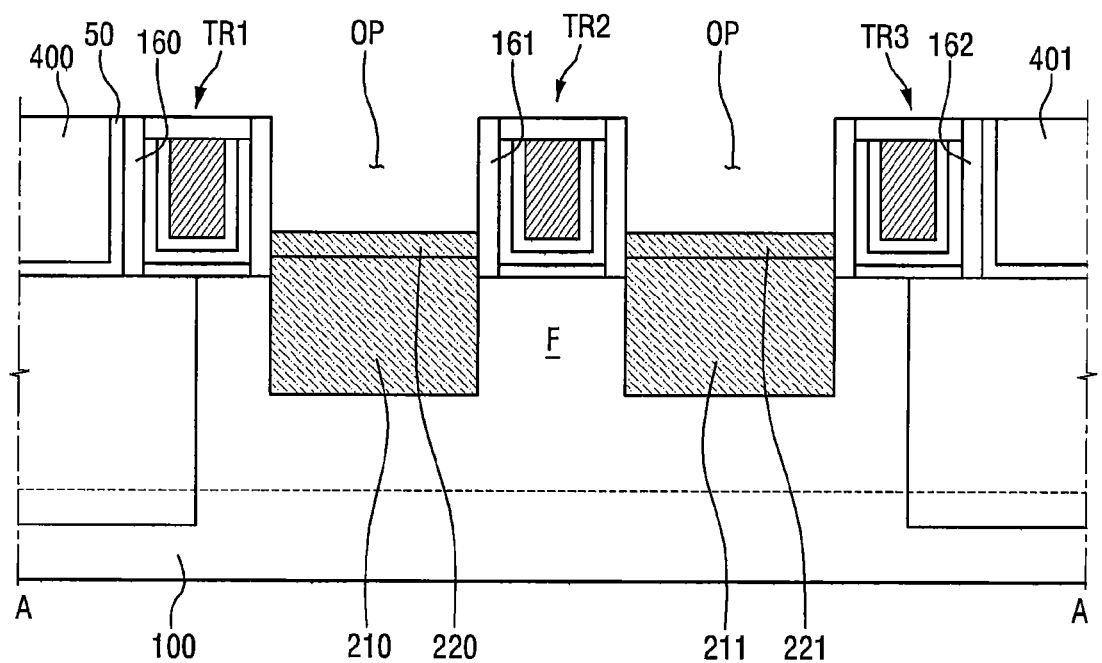

FIG. 14B is a cross-sectional view taken along the line A-A of FIG. 14A. Referring to FIGS. 4, 13, 14A and 14B, the first sacrificial layer patterns 61 and 62 and the etch stopping layer 50 formed in the first area ① may be removed to form openings OP (Block 150). Each of the openings OP may have a curved-sidewall as illustrated in FIG. 14. In some embodiments, a wet etching process may be used to remove the first sacrificial patterns 61 and 62 and the etch stopping layer 50 formed in the first area ①.

For example, the first sacrificial patterns 61 and 62 may include polysilicon, and aqueous ammonia $NH_3$ may be used as an etching solution. As appreciated by the present inventors, the first sacrificial patterns 61 and 62 may be selectively removed with respect to the gate spacers 160, 161 and 162. If the insulating layer 400' is formed in the first area ①, hydrogen fluoride HF may be used as an etching solution in order to remove the insulating layer 400', and the hydrogen fluoride HF may also etch the gate spacers 160, 161 and 162 formed on the first to third gate structures TR1, TR2, and TR3. Even though only portions of the gate spacers 160, 161, and 162 are etched, an insulation property may deteriorate, and the reliability of a semiconductor device may be reduced. As discussed herein, according to some embodiments of the present inventive concept, the gate spacers 160, 161, and 162 may not be etched when the first sacrificial patterns 61 and 62 that are formed in the first area ① are etched using aqueous ammonia $NH_3$, and the reliability of the semiconductor device may be maintained.

The contact barrier layers 310 and 311 and the contact metal patterns 300 and 301 may be formed in the openings OP in the first area ① (Block 160). For example, the contact barrier layers 310 and 311 may include Ti, TiN or a stacked layer thereof. The contact barrier layers 310 and 311 may be formed using an Atomic Layer Deposition (ALD) process or a Chemical Vapor Deposition (CVD) process.

The contact metal patterns 300 and 301 may be formed on the contact barrier layers 310 and 311. The contact metal patterns 300 and 301 may include metal materials. For example, the contact metal patterns 300 and 301 may include tungsten (W). The contact metal patterns 300 and 301 may be a contact which electrically connects upper semiconductor patterns with lower semiconductor patterns.

Hereinafter, a semiconductor device and a method of fabricating the semiconductor device according to some embodiments of the present inventive concept will be described.

Figure 15:
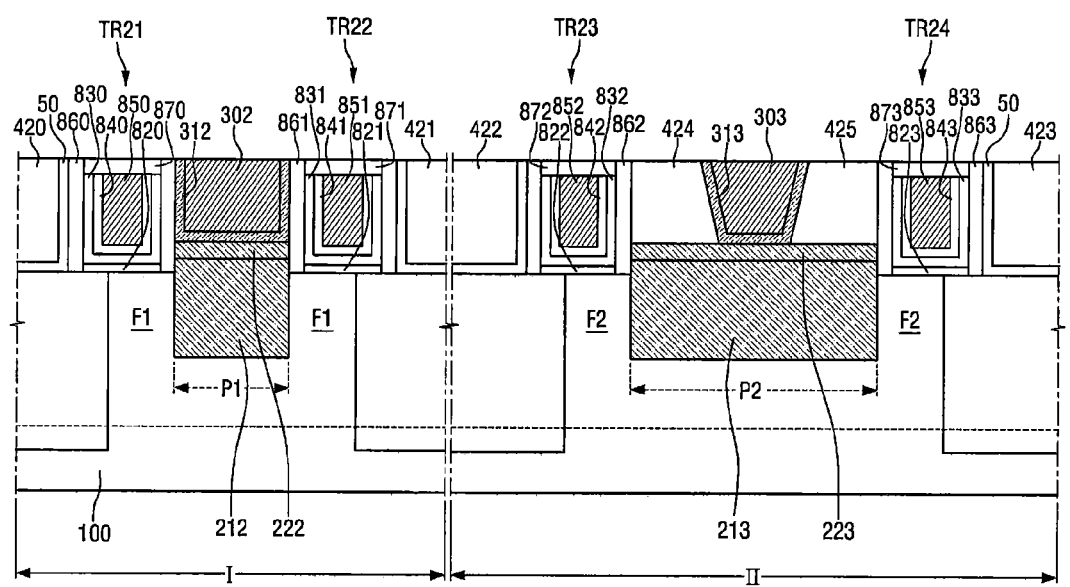
FIG. 15 is a cross-sectional view of a semiconductor device according to some embodiments of the present inventive concept.
Figure 16:
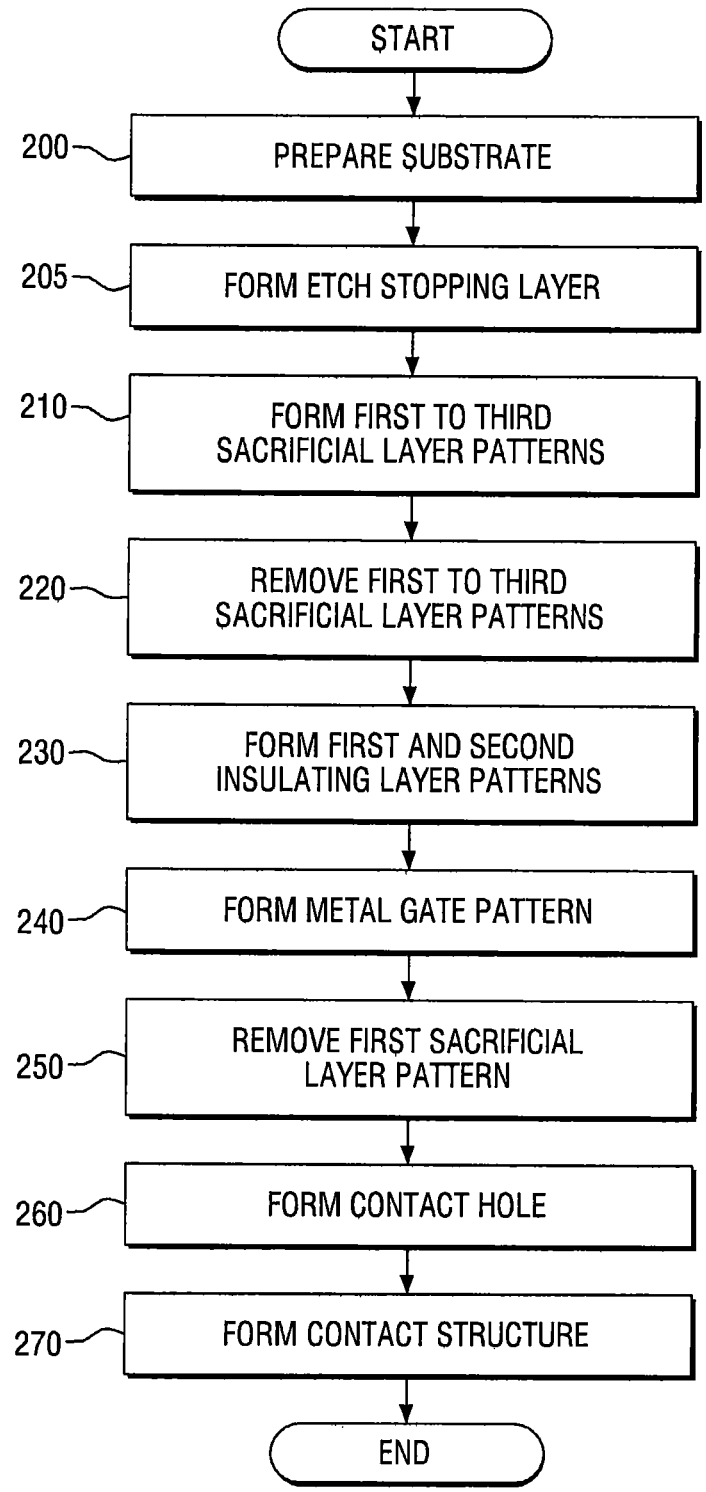
FIG. 16 is a flowchart illustrating a method of fabricating a semiconductor device according to some embodiments of the present inventive concept.

FIG. 15 is a cross-sectional view of a semiconductor device according to some embodiments of the present inventive concept. FIG. 16 is a flowchart illustrating a method of fabricating a semiconductor device according to some embodiments of the present inventive concept. FIGS. 17 to 21 are cross-sectional views illustrating a method of fabricating a semiconductor device according to some embodiments of the present inventive concept. Referring to FIG. 15, a semiconductor device 2 may include a substrate 100, a first fin F1, a second fin F2, an etch stopping layer 50, a first gate structure TR21, a second gate structure TR22, a third gate structure TR23, a fourth gate structure TR24, source/drain regions 212 and 213, silicides 222 and 223, contact metal patterns 302 and 303, contact barrier layers 312 and 313 and insulating layer patterns 420 to 425.

The substrate 100 may be a hard-type substrate such as a silicon substrate, a silicon on insulator (SOI), a gallium arsenide substrate, a silicon germanium substrate, a ceramic substrate, a quartz substrate and a glass substrate for a display or a flexible plastic substrate including, for example, polyimide, polyester, polycarbonate, polyethersulfone, polymethylmethacrylate, polyethylene naphthalate and/or polyethyleneterephthalate.

The substrate 100 may include a first area I and a second area II, In some embodiments, a first pitch P1 between the first gate structure TR21 and the second gate structure TR22 that are in the first area I may be relatively small, and a second pitch P2 between the third gate structure TR23 and the fourth gate structure TR24 that are in the second area II may be relatively large as illustrated in FIG. 15. The first pitch P1 may be less than the second pitch P2.

The first and second fins F1 and F2 may be formed on the substrate 100. The first and second fins F1 and F2 may protrude from the substrate 100. The first and second fins F1 and F2 may be part of the substrate 100 and may include an epitaxial layer grown from the substrate 100.

The etch stopping layer 50 may be formed to include, for example, a silicon oxide and/or a silicon nitride, but the etch stopping layer 50 is not limited thereto. The etch stopping layer 50 may determine an etching depth. In other words, an etching process may not etch the etch stopping layer 50 and may thus stop at the etch stopping layer 50.

The first gate structure TR21 and the second gate structure TR22 may be formed on the first area I.

The first gate structure TR21 may be formed on the first fin F1 in a direction that crosses the first fin F1.

The first gate structure TR21 may include an interface layer 820, a gate insulating layer 830, a work function adjustment layer 840, a gate metal 850, a gate spacer 860 and a capping layer 870 which are sequentially formed on the first fin F1.

The interface layer 820 may be formed on the first fin F1. The interface layer 820 may include a low k material layer that has a dielectric constant k of about 9 or less. The low k material may be, for example, a silicon oxide layer (dielectric constant k is about 4) or a silicon oxide layer (dielectric constant k is about between 4 and 8 according to content of the oxygen atoms and nitride atoms). Further, the interface layer 820 may be formed of a silicate or may be formed of a combination of the above-described layers.

The gate insulating layer 830 may be formed on the interface layer 820. In some embodiments, the interface layer 820 may be omitted, and the gate insulating layer 830 may be formed on the first fin F1.

The gate insulating layer 830 may include a material having a high dielectric constant k. For example, the gate insulating layer 830 may include HfSiON, $HfO_2$, $ZrO_2$, $Ta_2O_5$, $TiO_2$, $SrTiO_3$, $BaTiO_3$ and/or $SrTiO_3$.

The gate insulating layer 830 may be formed to have an appropriate thickness depending on device types. For example, the gate insulating layer 830 may be $HfO_2$, the gate insulating layer 830 may have a thickness of about 50 Å or less, but the gate insulating layer 830 and the thickness of the gate insulating layer 830 are not limited thereto. According to some embodiments of the present inventive concept, as illustrated in FIG. 15, the gate insulating layer 830 may extend upward along a sidewall of the gate spacer 860.

The work function adjustment layer 840 may be formed on the gate insulating layer 830. The work function adjustment layer 840 may contact the gate insulating layer 830. The work function adjustment layer 840 may be used for work function adjustment.

In some embodiments, the work function adjustment layer 840 may include a metal nitride. For example, the work function adjustment layer 840 may include Mo, Pd, Ru, Pt, TiN, WN, TaN, Ir, TaC, RuN, TiAl, TaAlC, TiAlN and/or MoN. Specifically, the work function adjustment layer 840 may be a single layer including TiN or a dual layer including a lower layer including TiN and an upper layer including TaN, but the work function adjustment layer 840 is not limited thereto.

According to some embodiments of the present inventive concept, as illustrated in FIG. 15, the work function adjust layer 840 may also extend upward along the sidewall of the gate spacer 860.

The gate metal 850 may be formed on the work function adjustment layer 840. The gate metal 850 may contact the work function adjustment layer 840. The gate metal 850 may be formed in a space defined by the work function adjustment layer 840. In some embodiments, the gate metal 850 may fill the space defined by the work function adjustment layer 840. The gate metal 850 may include a conductive material such as tungsten (W) and aluminum (Al), but the gate metal 850 is not limited thereto.

The gate spacer 860 may be formed on at least one side of the side surfaces of the first gate structure TR21. The gate spacer 860 may include a nitride layer, an oxynitride layer, and/or a low-k material layer.

The gate spacer 860 may have an I shape as illustrated in FIG. 15, but a shape of the gate spacer 860 is not limited thereto. The gate spacer 860 may have different shapes. For example, the shape of the gate spacer 860 may be a curved shape or an L shape.

The gate spacer 860 may be a single layer as illustrated in FIG. 15, but the gate spacer 860 is not limited thereto. In some embodiments, the gate spacer 860 may include multiple layers.

The capping layer 870 may be formed on the gate metal 850. The capping layer 870 may contact the gate metal 850. The capping layer 870 may be formed in a space defined by an upper surface of the gate metal 850. In some embodiments, the capping layer 870 may fill the space defined by the upper surface of the gate metal 850. For example, the capping layer 870 may include a silicon nitride (SiN), but the capping layer 870 is not limited thereto.

The second gate structure TR22 may have substantially the same structure as a structure of the first gate structure TR21. The second gate structure TR22 may include an interface layer 821, a gate insulating layer 832, a work function adjustment layer 841, a gate metal 851, a gate spacer 861 and a capping layer 871.

The interface layer 821, the gate insulating layer 831, the work function adjustment layer 841, the gate metal 851, the gate spacer 861 and the capping layer 871 are substantially the same as the interface layer 820, the gate insulating layer 830, the work function adjustment layer 840, the gate metal 850, the gate spacer 860 and the capping layer 870, respectively.

The third gate structure TR23 and the fourth gate structure TR24 may be formed on the second area II.

The third gate structure TR23 may have substantially the same structure as the structure of the first gate structure TR21. The third gate structure TR23 may include an interface layer 822, a gate insulating layer 832, a work function adjustment layer 842, a gate metal 852, a gate spacer 862 and a capping layer 872.

The interface layer 822, the gate insulating layer 832, the work function adjustment layer 842, the gate metal 852, the gate spacer 862 and the capping layer 872 are substantially the same as the interface layer 820, the gate insulating layer 830, the work function adjustment layer 840, the gate metal 850, the gate spacer 860 and the capping layer 870, respectively.

The fourth gate structure TR24 may have substantially the same structure as the structure of the first gate structure TR21. The fourth gate structure TR24 may include an interface layer 823, a gate insulating layer 833, a work function adjustment layer 843, a gate metal 853, a gate spacer 863 and a capping layer 873.

The interface layer 823, the gate insulating layer 833, the work function adjustment layer 843, the gate metal 853, the gate spacer 863 and the capping layer 873 are substantially the same as the interface layer 820, the gate insulating layer 830, the work function adjustment layer 840, the gate metal 850, the gate spacer 860 and the capping layer 870, respectively.

The source/drain regions 212 and 213 may be formed between the first gate structure TR21 and the second gate structure TR22 and between the third gate structure TR23 and the fourth gate structure TR24, respectively. The source/drain regions 212 and 213 may be insulated by gate spacers 860, 861, 862 and 863.

In some embodiments of the present inventive concept, the source/drain regions 212 and 213 may be formed using an epitaxial growth process, but different processes may be used to form the source/drain regions 212 and 213.

The silicides 222 and 223 may be formed on the source/drain regions 212 and 213. The silicides 222 and 223 may include, for example, NiPtSi, NiSi, CoSi and/or TiSi, but the silicides 222 and 223 are not limited thereto.

The silicides 222 and 223 may be formed using a silicidation process of upper surfaces of the source/drain regions 212 and 213 before the contact metal patterns 302 and 303 and the contact barrier layers 312 and 313 are formed.

The contact barrier layers 312 and 313 may be formed on bottom surfaces and sidewalls of the contact metal patterns 302 and 303 which are formed after removing the etch stopping layer 50. For example, the contact barrier layers 312 and 313 may include Ti, TiN or a stacked layer thereof.

The contact barrier layers 312 and 313 may be formed using an atomic layer deposition (ALD) process or a chemical vapor deposition (CVD) process.

The contact metal patterns 302 and 303 may be formed on the contact barrier layers 312 and 313. The contact metal patterns 302 and 303 may include metal materials. For example, the contact metal patterns 302 and 303 may include tungsten (W). The contact metal patterns 302 and 303 may be a contact which electrically connects upper semiconductor patterns with lower semiconductor patterns.

The contact metal pattern 303 may be formed on the source/drain regions 213 between the fifth insulating layer 424 and the sixth insulating layer 425. A process of forming the contact metal pattern 303 will be described below.

The first insulating pattern 420 may be formed on a side surface of the first gate structure TR21, and the second insulating pattern 421 may be formed on a side surface of the second gate structure TR22. Further, the third insulating pattern 422 may be formed on a side surface of the third gate structure TR23, and the fourth insulating pattern 423 may be formed on a side surface of the fourth gate structure TR24.

A method of fabricating the semiconductor device 2 according to some embodiments of the present inventive concept will be described with reference to FIGS. 16 to 21.

Figure 17:
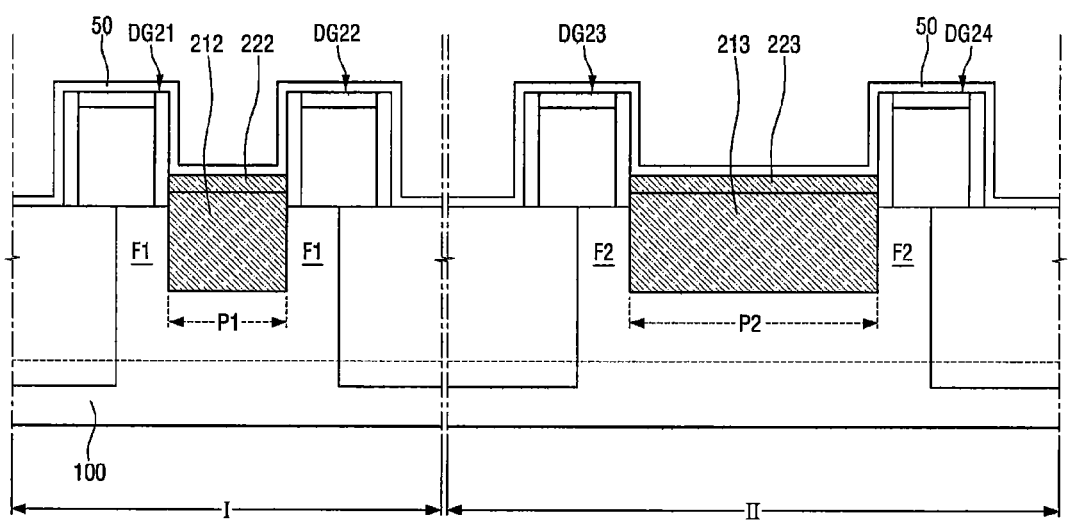
FIGS. 17 to 21 are cross-sectional views illustrating intermediate operations of a method of fabricating a semiconductor device according to some embodiments of the present inventive concept.

Referring to FIGS. 16 and 17, first to fourth dummy gate patterns DG21, DG22, DG23, and DG24 may be formed on a substrate 100 including a first area I and a second area II (Block 200). The first and second dummy gate patterns DG21 and DG22 may be formed in the first area I, and the third and fourth dummy gate patterns DG23 and DG24 may be formed in the second area II.

A first pitch P1 between the first dummy gate pattern DG21 and the second dummy gate pattern DG22 may be relatively small, and a second pitch P2 between the third dummy gate pattern DG23 and the fourth dummy gate pattern DG24 may be relatively large. In some embodiments, the first pitch P1 may be less than the second pitch P2 as illustrated in FIG. 17.

The first area I may include a first impurity area that may be formed between the first dummy gate pattern DG21 and the second dummy gate pattern DG22, and a non-impurity area. The second area II may include a second impurity area that may be formed between the third dummy gate pattern DG23 and the fourth dummy gate pattern DG24.

The first and second impurity areas may refer to source/drain regions 212 and 213, respectively. Further, the non-impurity area refers to an area where the source/drain region 212 is not formed in the first area I.

An etch stopping layer 50 may be formed on the substrate 100 (Block 205). In some embodiments, the etch stopping layer 50 may be formed to cover the substrate 100, the first to fourth dummy gate patterns DG21, DG22, DG23 and DG24 and the silicides 222 and 223. The etch stopping layer 50 may be formed as, for example, a silicon oxide layer or a silicon nitride layer, but the etch stopping layer 50 is not limited thereto. The etch stopping layer 50 may protect the source/drain regions 212 and 213 and silicides 222 and 223 during subsequent etching processes such that the source/drain regions 212 and 213 and silicides 222 and 223 may not be etched. The etch stopping layer 50 may determine an etching depth. In other words, an etch process may not etch the etch stopping layer 50 and may thus stop at the etch stopping layer 50.

Figure 18:
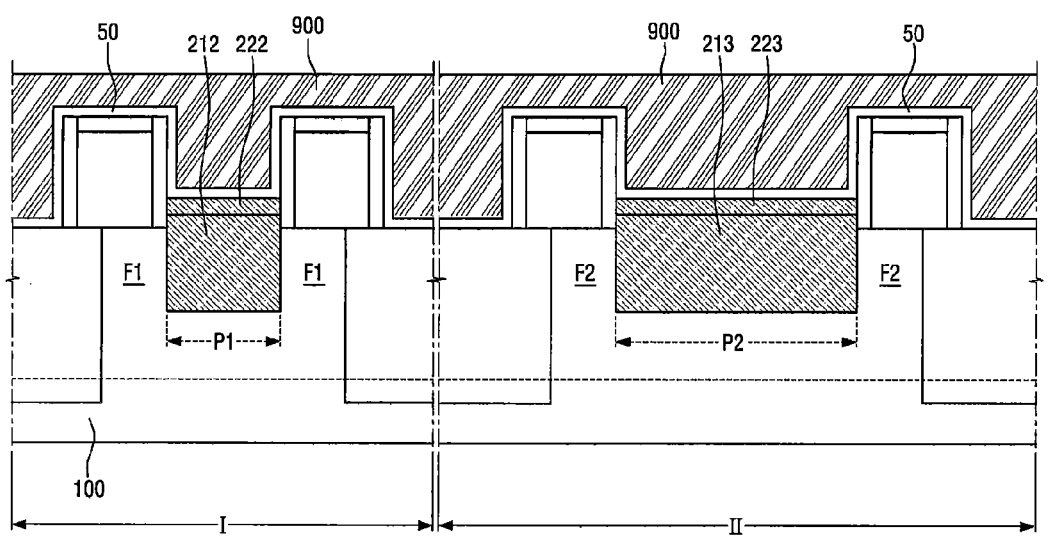
Figure 19:
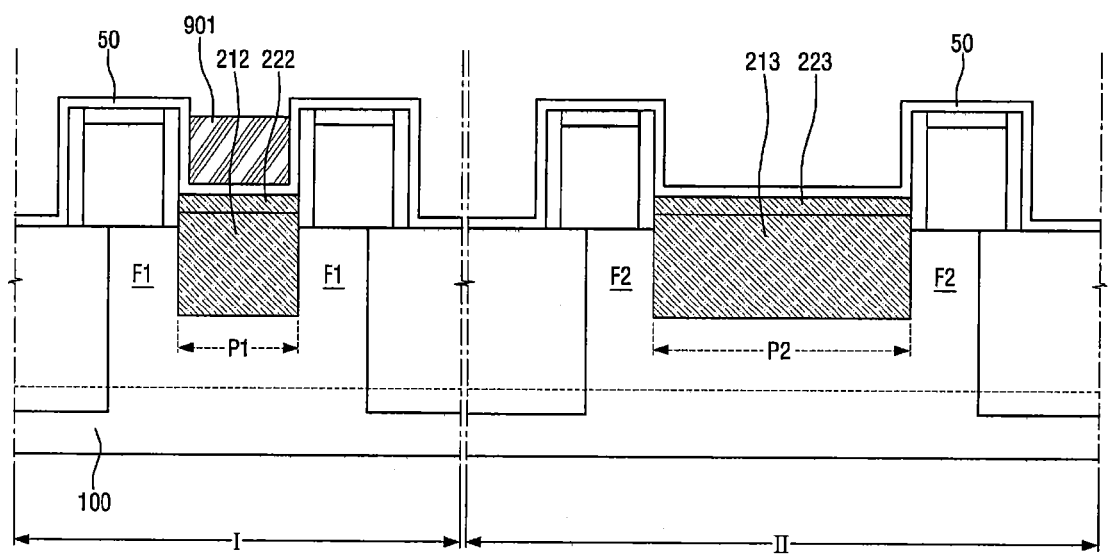

Referring to FIGS. 16, 18 and 19, a sacrificial layer material 900 may be formed on the substrate 100 (Block 210), and the sacrificial layer material 900 may be partially removed such that a first sacrificial pattern 901 may remain on the first impurity area between the first dummy gate pattern DG21 and the second dummy gate pattern DG22 (Block 220).

Figure 20:
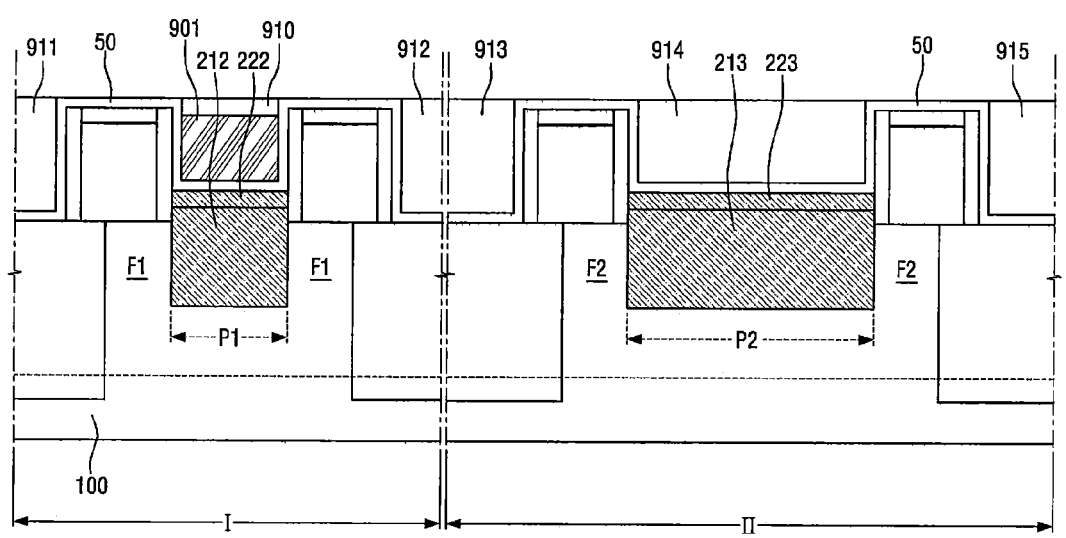

Referring to FIGS. 16 and 20, a first insulating layer pattern 911 and a second insulating layer pattern 912 may be formed in the non-impurity area of the first area I, and a third insulating pattern 913, a fourth insulating pattern 914, and a fifth insulating pattern 915 may be formed in the second area II (Block 230). A portion of an insulating layer 910 may remain on the first sacrificial layer pattern 901.

Figure 21:
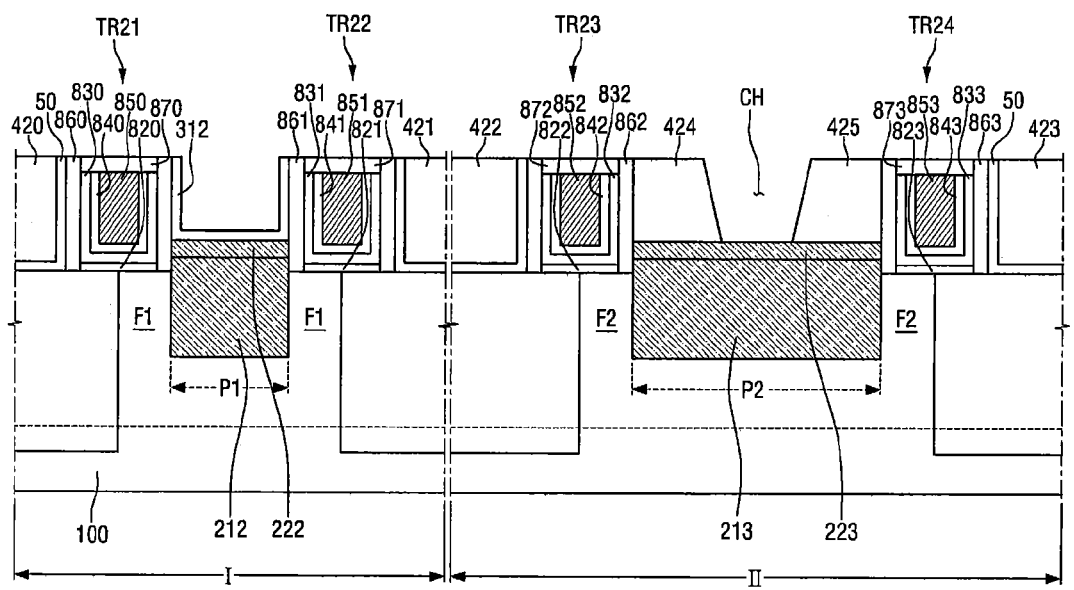

Referring to FIGS. 16 and 21, first to fourth dummy gate patterns DG21, DG22, DG23 and DG24 may be replaced with first to fourth gate structures TR21, TR22, TR23 and TR24 (Block 240), the portion of the insulating layer 910 on the first sacrificial layer pattern 901 and the first sacrificial layer pattern 901 may be removed (Block 250), and a portion of the fourth insulating layer pattern 914 may be removed to form a contact hole CH in the second area II (Block 260). The contact hole CH may expose a portion of the second impurity area.

A contact barrier layer 312 and a contact metal pattern 302 may be formed on the first impurity area, and a contact barrier layer 313 and a contact metal pattern 303 may be formed in the contact hole CH (Block 270).

Figure 22:
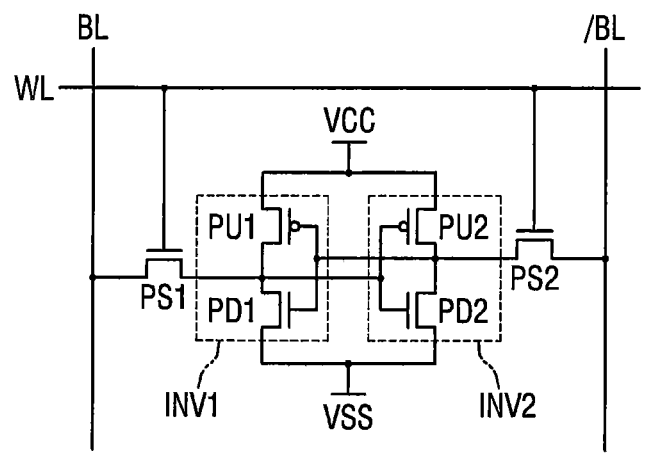
FIGS. 22 to 24 are a circuit diagram and a layout for illustrating a semiconductor device according to some embodiments of the present inventive concept.
Figure 23:
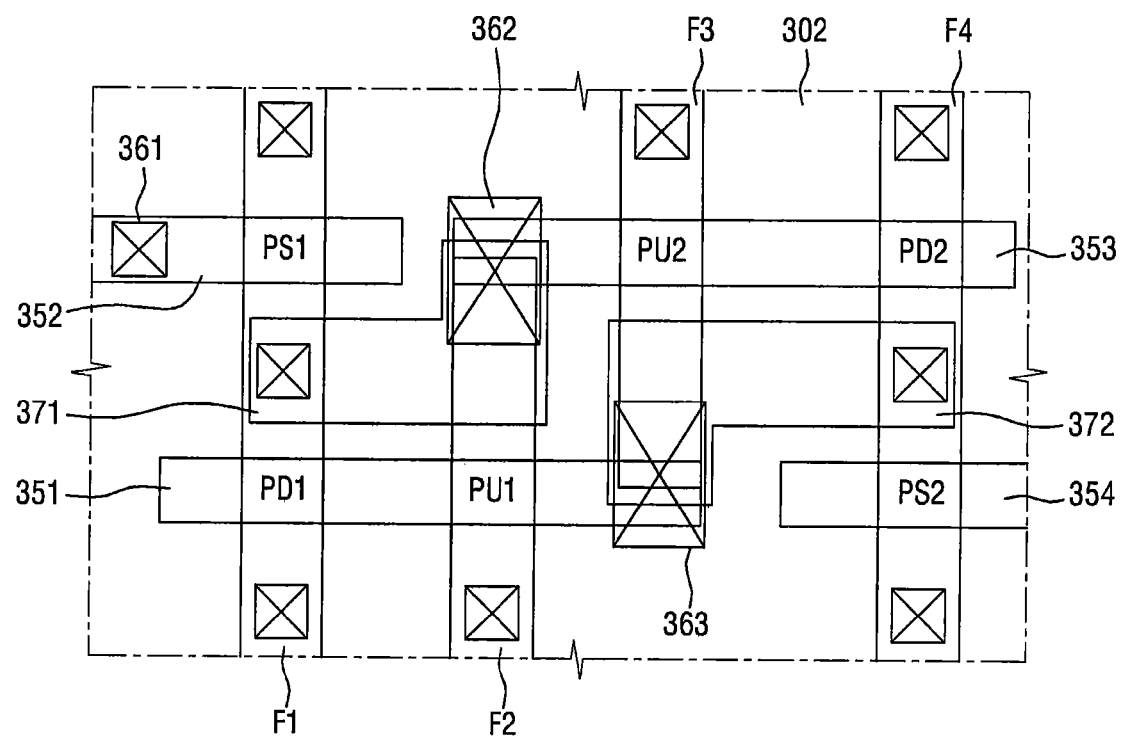
Figure 24:
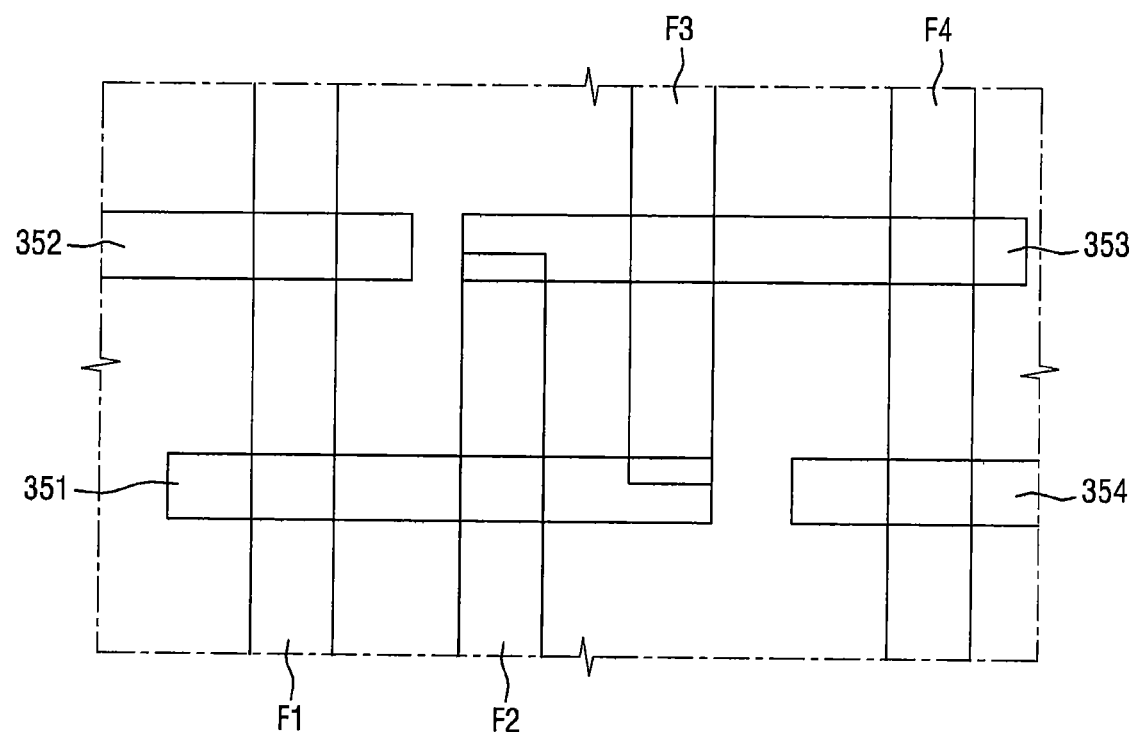

FIGS. 22 through 24 are illustrating a semiconductor device according to some embodiments of the present inventive concept.

FIGS. 22 and 23 are a circuit diagram and a layout of a semiconductor device according to some embodiments of the present inventive concept. FIG. 24 illustrates the fin-shaped channels and the gate structures of FIG. 23. Although FIGS. 22 to 24 illustrate a Static random-access memory (SRAM), the semiconductor device according to some embodiments of the present inventive concept may be any device including fin-shaped channels.

Referring to FIG. 22, the semiconductor device according to some embodiments of the present inventive concept may include a pair of inverters INV1 and INV2 which are connected in parallel between a power node Vcc and a ground node Vss, and a first pass transistor PS1 and a second pass transistor PS2 which are connected to the output node of respective inverters INV1 and INV2.

The first pass transistor PS1 and the second pass transistor PS2 may be respectively connected to the bit line BL and the complementary bit line /BL. The gate of the first pass transistor PS1 and the second pass transistor PS2 may be connected to the word line WL.

The first inverter INV1 may include a first pull-up transistor PU1 and a second pull-down transistor PD1 which are connected in series, and a second inverter INV2 may include a second pull-up transistor PU2 and a second pull-down transistor PD2 which are connected in series.

Each of the first pull-up transistor PU1 and the second pull-up transistor PU2 may be a PMOS transistor, and each of the first pull-down transistor PD1 and the second pull-down transistor PD2 may be an NMOS transistor.

In order for the first inverter INV1 and the second inverter INV2 to form one latch circuit, the input node of the first inverter INV1 may be connected to the output node of the second inverter INV2, and the input node of the second inverter INV2 may be connected to the output node of the first inverter INV1.

Referring to FIGS. 22 to 24, the first fin F1, the second fin F2, the third fin F3 and the fourth fin F4, which are spaced apart from each other, may extend in a first direction as illustrated in FIG. 23. The second fin F2 and the third fin F3 may have lengths shorter than lengths of the first fin F1 and the fourth fin F4 in the first direction.

The first gate structure 351, the second gate structure 352, the third gate structure 353 and the fourth gate structure 354 may extend in a second direction as illustrated in FIG. 23 and may cross the first fin F1 and the fourth fin F4.

Referring to FIG. 24, the first gate structure 351 may be formed to cross the first fin F1 and the second fin F2 and to partially overlap with an end portion of the third fin F3. The third gate structure 353 may be formed to cross the fourth fin F4 and the third fin F3 and to partially overlap with an end portion of the second fin F2. The second gate structure 352 and the fourth gate structure 354 may be formed to cross the first fin F1 and the fourth fin F4, respectively.

As illustrated in FIG. 23, the first pull-up transistor PU1 may be formed in an area around an area where the first gate structure 351 crosses the second fin F2, the first pull-down transistor PD1 may be formed in an area around an area where the first gate structure 351 and the first fin F1 cross, and the first pass transistor PS1 may be formed in an area around an area where the second gate structure 352 and the first fin F1 cross.

The second pull-up transistor PU2 may be formed in an area around an area where the third gate structure 353 and the third fin F3 cross, the second pull-down transistor PD2 may be formed in an area around an area where the third gate structure 353 and the fourth fin F4 cross, and the second pass transistor PS2 may be defined in an area around an area where the fourth gate structure 354 and the fourth fin F4 cross.

Recesses may be formed at both sides of the areas where the first to fourth gate structures 351 to 354 and the first to fourth fins F1 to F4 cross, source/drain regions may be formed in the recesses, and contacts 361 may be formed.

The shared contact 362 may connect the first fin F2, the third gate structure 353 and the wire 371. The shared contact 363 may connect the third fin F3, the first gate structure 351 and the wire 372.

The first pull-up transistor PU1, the first pull-down transistor PD1, the first pass transistor PS1, the second pull-up transistor PU2, the second pull-down transistor PD2 and the second pass transistor PS2 may include a semiconductor device according to some embodiments of the present inventive concept.

Hereinafter, an electronic system including a semiconductor device formed using a method according to some embodiments of the present inventive concept will be described.

Figure 25:
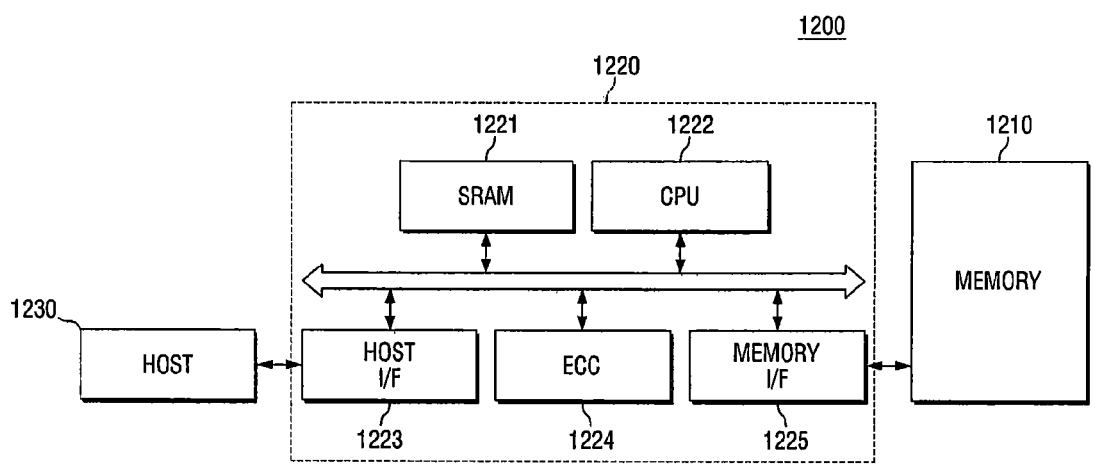
FIG. 25 is a block diagram of a memory card including a semiconductor device formed using a method according to some embodiments of the present inventive concept.

FIG. 25 is a block diagram of a memory card including a semiconductor device according to some embodiments of the present inventive concept.

Referring to FIG. 25, a memory card 1200 may include a memory 1210 including a semiconductor device formed using a method according to various embodiments of the present inventive concept. The memory card 1200 may include a memory controller 1220 which controls data exchange between a host 1230 and the memory 1210. A SRAM 1221 may be used as an operation memory of a central processing unit (CPU) 1222. The host interface 1223 may include a protocol for connection to the memory card 1200 and data exchange by the host 1230. An error correction code (ECC) 1224 may detect and correct errors of data which has been read from the memory 1210. The memory interface 1225 may interface with the memory 1210. The CPU 1222 may perform overall control operation related with the data exchange of the memory controller 1220.

Figure 26:
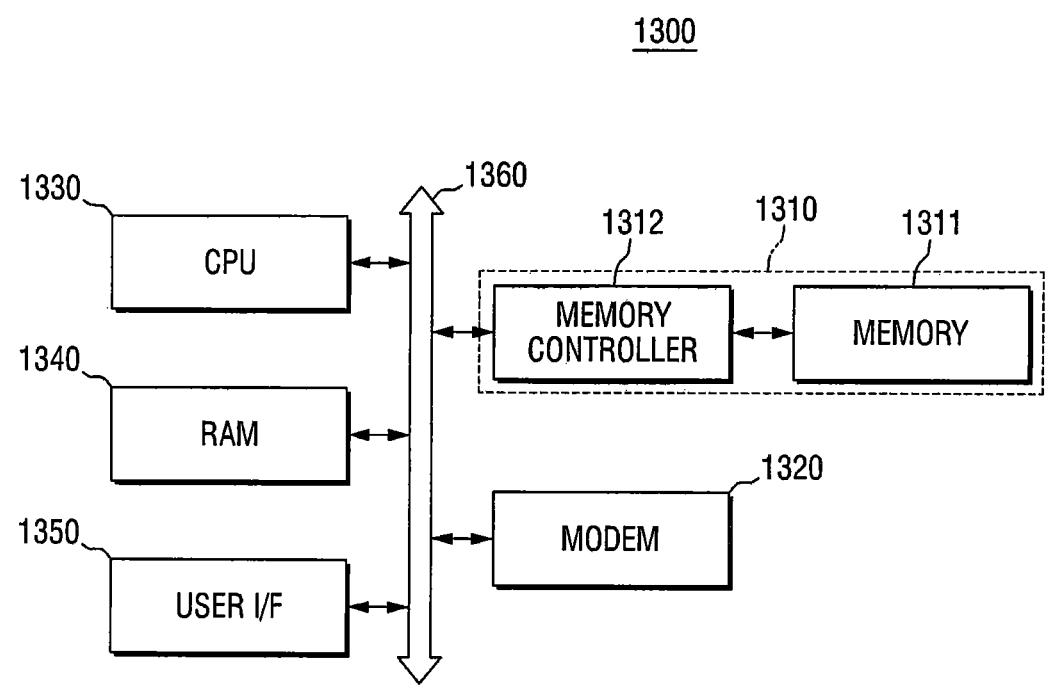
FIG. 26 is a block diagram of an information processing system including a semiconductor device formed using a method according to some embodiments of the present inventive concept.

FIG. 26 is a block diagram of an information processing system including a semiconductor device that is formed using a method according to some embodiments of the present inventive concept.

Referring to FIG. 26, an information processing system 1300 may include a memory system 1310 including a semiconductor device formed using a method according to various embodiments of the present inventive concept. The information processing system 1300 may also include a modem 1320, a central processing unit (CPU) 1330, a RAM 1340, and a user interface 1350 which are electrically connected with a system bus 1360. The memory system 1310 may include a memory 1311 and a memory controller 1312 and may have substantially the same configuration as that of the memory card illustrated in FIG. 32. The data which is processed by the CPU 1330 and data which is received from an external device may be stored in the memory system 1310. The information processing system 1300 may be applied to a memory card, a SSD, a camera image sensor, and other various chipsets. For example, the memory system 1310 may be configured so that the SSD may be adopted, and in this case, the information processing system 1300 may stably and reliably process mass data.

Figure 27:
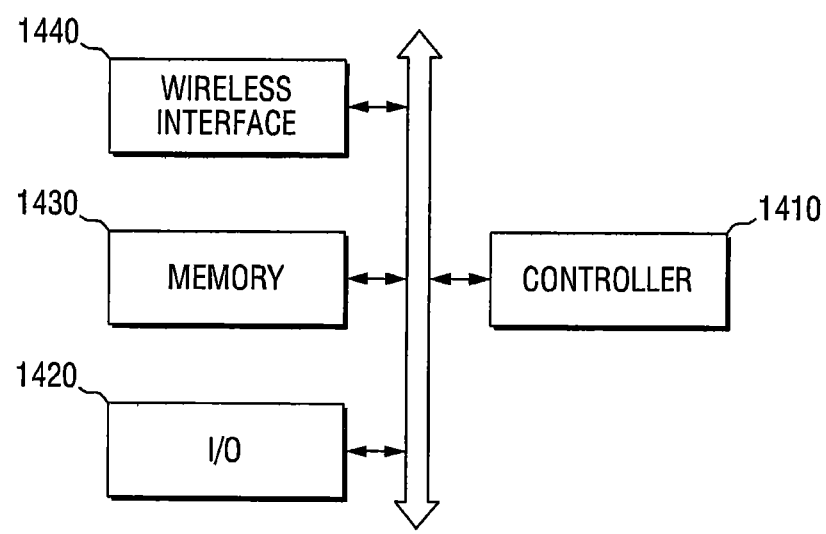
FIG. 27 is a block diagram of an electronic device including a semiconductor device formed using a method according to some embodiments of the present inventive concept.

FIG. 27 is a block diagram of an electronic device including a semiconductor device formed using a method according to some embodiments of the present inventive concept.

Referring to FIG. 27, an electronic device 1400 may include a semiconductor device formed using a method according to various embodiments of the present inventive concept. The electronic device 1400 may be used in a wireless communication device (e.g., a PDA, a notebook computer, a portable computer, a web tablet, a wireless phone, and/or a wireless digital music player) or in various devices which exchange information in a wireless communication environment.

The electronic device 1400 may include a controller 1410, an input/output device 1420, a memory 1430, and a wireless interface 1440. Here, the memory 1430 may include a semiconductor device which has been fabricated using a method according to various embodiments of the present inventive concept. The controller 1410 may include a microprocessor, a digital signal processor or a processor similar thereto. The memory 1430 may be used to store a command (or user data) which is processed by the controller 1410. The wireless interface 1440 may be used to exchange data through a wireless data network. The wireless interface 1440 may include an antenna and/or a wireless transceiver. The electronic device 1400 may use a third generation communication system protocol such as CDMA, GSM, NADC, E-TDMA, WCDMA, and CDMA2000.

In some embodiments, a semiconductor device formed using a method according to some embodiments of the present inventive concept may include a multi gate field effect transistor (MuGFET) such as a fin field effect transistor (FinFET).

In some embodiments, a semiconductor device formed using a method according to some embodiments of the present inventive concept may include a logic area and an SRAM area, and a transistor according to some embodiments may be formed as logic nFET, logic pFET, SRAM nFET or SRAM pFET disposed in the logic area or SRAM area. It will be understood that the present inventive concept is not limited to the logic area and the SRAM area, and the present inventive concept may also be applied to the logic area and an area where various memory devices are formed (e.g., DRAM, MRAM, RRAM, and PRAM).

The embodiments of the present inventive concept have been described with reference to the attached drawings, but the present inventive concept is not limited to the above-described embodiments and may be made in various other forms. Further, one of ordinary skill in the art would understand that the present inventive concept may be performed in other specific forms without changing the technical idea or essential features of the present inventive concept. Hence, it should be understood that the above-described embodiments are merely examples and are not limitative. Thus, to the maximum extent allowed by law, the scope is to be determined by the broadest permissible interpretation of the following claims and their equivalents, and shall not be restricted or limited by the foregoing detailed description.

What is claimed is:

1. A method of forming an integrated circuit device, the method comprising:
   forming a gate structure on a substrate, the gate structure extending longitudinally in a first direction in plan view;
   forming a first sacrificial pattern and a second sacrificial pattern on opposing sides of the gate structure respectively;
   partially replacing the first sacrificial pattern with a first insulating pattern such that a portion of the first sacrificial pattern remains in the first insulating pattern and replacing the second sacrificial pattern with a second insulating pattern; and
   replacing at least some of the portion of the first sacrificial pattern that remains in the first insulating pattern with a conductive pattern,
   wherein the conductive pattern has a first width in the first direction adjacent the gate structure and has a second width in the first direction adjacent a medial point of the conductive pattern along a second direction that is a transverse direction of the gate structure, and the first width is greater than the second width.

2. The method of claim 1, further comprising forming a source/drain region in the substrate, the conductive pattern being electrically connected to the source/drain region.

3. The method of claim 2, wherein the conductive pattern contacts the source/drain region.

4. The method of claim 2, further comprising forming an insulating isolation pattern in the substrate, the second sacrificial pattern overlying the insulating isolation pattern.

5. The method of claim 2, wherein:
forming the first and second sacrificial patterns comprises forming the first sacrificial pattern having an upper surface disposed lower than an upper surface of the gate structure; and
partially replacing the first sacrificial pattern with the first insulating pattern comprises forming a portion of the first insulating pattern overlying the upper surface of the first sacrificial pattern.

6. The method of claim 5, further comprising replacing the gate structure with a metal gate structure comprising a metal gate electrode before replacing the at least some of the portion of the first sacrificial pattern with the conductive pattern.

7. The method of claim 6, wherein:
forming the first and second sacrificial patterns comprises forming the first and second sacrificial patterns comprising a non-insulating material comprising silicon; and
partially replacing the first sacrificial pattern with the first insulating pattern and replacing the second sacrificial pattern with the second insulating pattern comprises partially removing the first sacrificial pattern such that the portion of the first sacrificial pattern remains on the substrate and removing the second sacrificial pattern using an wet etching process.

8. The method of claim 7, further comprises forming an etch stopping layer between the substrate and the first and second sacrificial patterns, wherein:
the first and second sacrificial patterns comprise polysilicon; and
an etchant of the wet etching process comprises ammonia ($NH_3$).

9. The method of claim 1, wherein replacing the at least some of the portion of the first sacrificial pattern with the conductive pattern comprises entirely replacing the portion of the first sacrificial pattern that remains in the first insulating pattern with the conductive pattern.

10. The method of claim 1, wherein:
the conductive pattern comprises a contact plug that is electrically connected to the substrate; and
the contact plug has a non-uniform width in the first direction of the gate structure, the width of the contact plug monotonically decreasing in the second direction from adjacent the gate structure to proximate a medial point of the contact plug along the second direction.

11. The method of claim 10, wherein the contact plug has a U-shaped sidewall having a base and legs that extend from the base away from the contact plug in plan view.

12. The method of claim 1, wherein:
forming the gate structure comprises forming a first gate structure on the substrate;
replacing the at least some of the portion of the first sacrificial pattern that remains in the first insulating pattern with the conductive pattern comprises removing the at least some of the portion of the first sacrificial pattern thereby forming a first opening in the first insulating pattern and forming a first conductive pattern in the first opening; and
the method further comprises:
forming a second gate structure on the substrate;

forming a third sacrificial pattern on a side of the second gate structure;
replacing the third sacrificial pattern with a third insulating pattern;
forming a second opening in the third insulating pattern; and
forming a second conductive pattern in the second opening concurrently with forming the first conductive pattern in the first opening.

13. A method of forming an integrated circuit device, the method comprising:
forming a first gate structure and a second gate structure on a substrate, the first and second gate structures extending longitudinally in a first direction in plan view; and
forming a conductive pattern and an insulating pattern between the first and second gate structures, the conductive pattern being wider adjacent the first and second gate structures compared to between the first and second gate structures,
wherein the conductive pattern has a first width in the first direction adjacent the first and second gate structures and has a second width in the first direction between the first and second gate structures, and the first width is greater than the second width.

14. The method of claim 13, wherein the conductive pattern has a curved sidewall having a base and legs that extend from the base away from the conductive pattern in plan view.

15. The method of claim 13, further comprising forming a source/drain region in the substrate between the first and second gate structures, the conductive pattern being electrically connected to the source/drain region.

16. The method of claim 15, wherein the conductive pattern contacts the source/drain region.

17. The method of claim 13, further comprising:
forming a sacrificial pattern between the first and second gate structures, the sacrificial pattern comprising a non-insulating material comprising silicon;
partially replacing the sacrificial pattern with the insulating pattern such that a portion of the sacrificial pattern remains on the substrate; and
replacing at least some of the portion of the sacrificial pattern with the conductive pattern.

18. The method of claim 17, wherein:
forming the sacrificial pattern between the first and second gate structures comprises forming the sacrificial pattern in a recess defined by the first and second gate structures, the sacrificial pattern being recessed toward the substrate with respect to upper surfaces of the first and second gate structures; and
partially replacing the sacrificial pattern with the insulating pattern comprises partially removing the sacrificial pattern such that the portion of the sacrificial pattern remains on the substrate and forming the insulating pattern in the recess and on the portion of the sacrificial pattern.

19. The method of claim 17, further comprising replacing the first and second gate structures with a first metal gate structure and a second metal gate structure, respectively before replacing the at least some of the portion of the sacrificial pattern with the conductive pattern, each of the first and second metal gate structures comprising a metal gate electrode.

* * * * *